(12) United States Patent
Shimizu et al.

(10) Patent No.: US 6,400,173 B1
(45) Date of Patent: Jun. 4, 2002

(54) TEST SYSTEM AND MANUFACTURING OF SEMICONDUCTOR DEVICE

(75) Inventors: Isao Shimizu, Sawa; Masayuki Sato, Takasaki; Hiroshi Fukiage, Kodaira, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/692,468

(22) Filed: Oct. 20, 2000

(30) Foreign Application Priority Data

Nov. 19, 1999 (JP) .......................................... 11-329281

(51) Int. Cl.⁷ .......................... G01R 31/26; G01R 31/02

(52) U.S. Cl. ....................................... 324/765; 324/754

(58) Field of Search ................................ 324/765, 754, 324/755, 158.1, 758, 757, 760, 761

(56) References Cited

U.S. PATENT DOCUMENTS 6,246,245 B1 * 6/2001 Akram et al. ............... 324/754

OTHER PUBLICATIONS

"LSI Handbook", issued by Ohm Co., Ltd., Nov. 30, 1994, pp. 165–166, (with English translation of pp. 165–166).

* cited by examiner

Primary Examiner—N. Le
Assistant Examiner—James Kerveros
(74) Attorney, Agent, or Firm—Mattingly, Stanger & Malur, P.C.

(57) ABSTRACT

A test circuit is provided on a probe card or a wafer on which semiconductor chips to be tested are formed. The test circuit and each of the semiconductor chips to be tested are electrically connected to each other to perform testing, whereby the test can be carried out without using a tester. Conducting a test in such a wafer stage within an aging device allows the simplification or omission of a test subsequent to packaging.

12 Claims, 22 Drawing Sheets

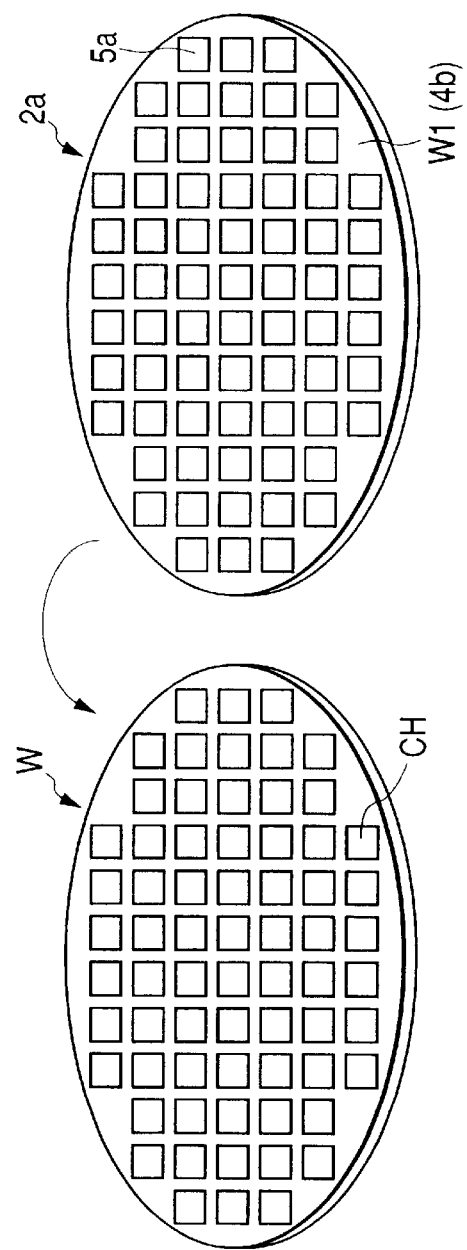
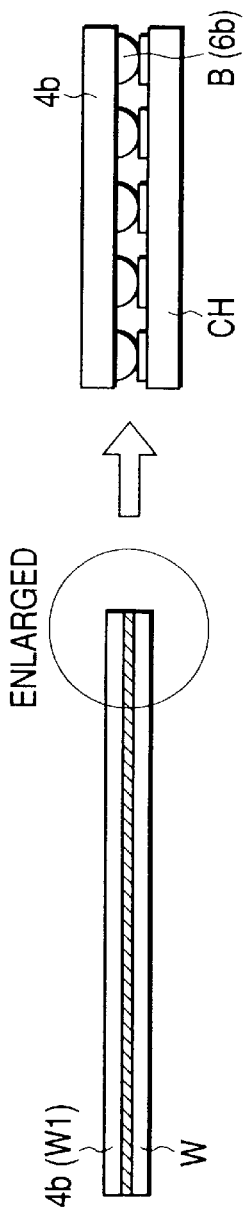

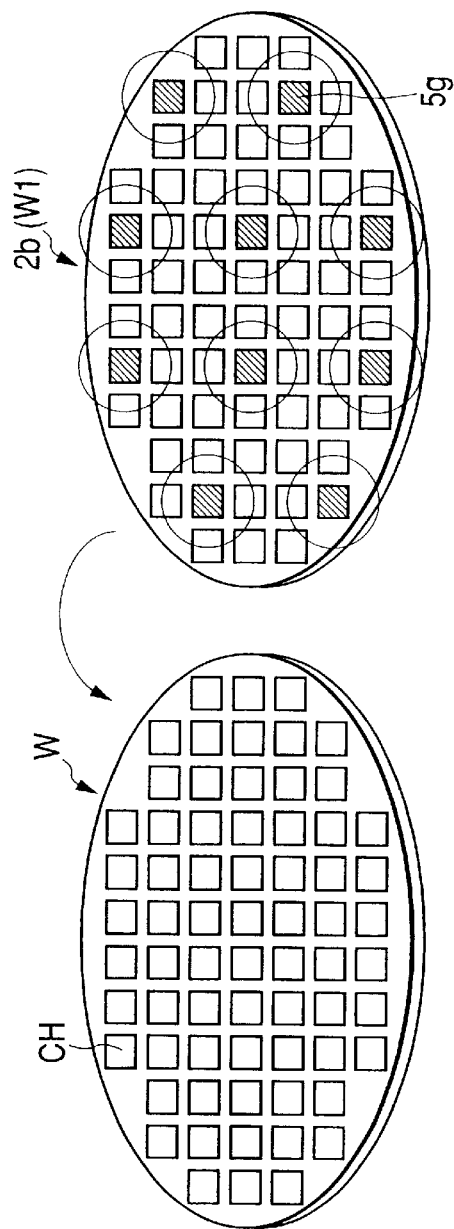
FIG. 16
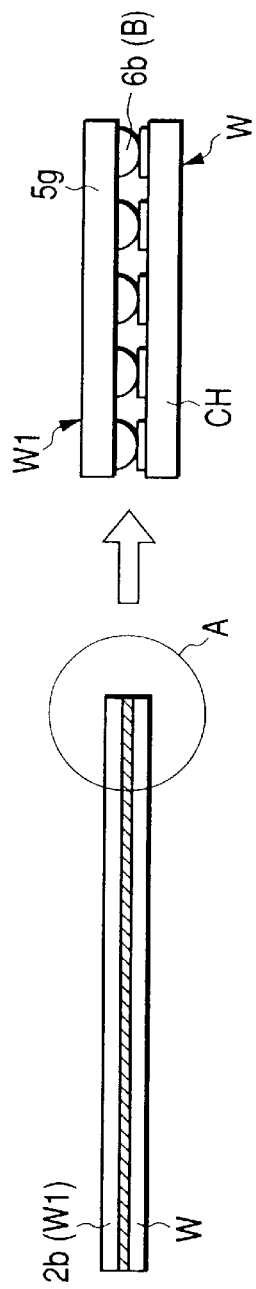
FIG. 17(a)
FIG. 17(b)

TEST SYSTEM AND MANUFACTURING OF SEMICONDUCTOR DEVICE

BACKGROUND OF THE INVENTION

The present invention relates to a technology effective for application to a test on a semiconductor integrated circuit device and manufacture thereof, and particularly to a technology effective for application to a test in a wafer stage.

As a system for testing a semiconductor device such as a logic integrated circuit (hereinafter called "logic IC"), there has commonly been known a system wherein test pattern data is generated by a device called "tester" and inputted to the logic IC, and a data signal outputted from the logic IC is compared with an expected value to thereby determine it. There is also known a test technology of a BIST (Built in self test) system in which a pattern generator or generating circuit like a pseudo-random number generating circuit, for generating random test patterns is built in a semiconductor device.

In the test system in which the tester externally inputs the test pattern data to the logic IC to thereby perform testing, a shift scan system has been adopted wherein a pre-designed scan path is provided so that flip-flops provided within a semiconductor integrated circuit device are coupled to one another so as to operate as a shift register, and test data is directly inputted to the back of an IC through the scan path and a test result is outputted, whereby the amount of test patterns is reduced.

The BIST system is a self-test conducting system wherein tester functions comprised of a test pattern generating circuit, a test output compressing circuit, a test result determination circuit, etc. are built in a chip for a semiconductor integrated circuit device, and the semiconductor integrated circuit device itself executes a test and outputs the result of test.

On the other hand, the test on the logic IC referred to above has been carried out in two stages of: a probe test done while a probe is being brought into contact with each of pads for semiconductor chips in a wafer stage and a burn-in test done by inserting an IC into a socket provided on a test board in stage at which each semiconductor chip is enclosed in a package. In the burn-in test, a plurality of ICs can be placed on the test board to simultaneously perform their tests.

Incidentally, as the known example in which this type of test system about the semiconductor integrated circuit device has been described in details, there is known a technology disclosed in "LSI Handbook" issued by Ohm Co., Ltd., and (edited) by Institute of Electronics and Communication Engineers of Corporation, P165, P166, Nov. 30, 1984. Configurations or the like of various scan path systems have been described in the present reference.

SUMMARY OF THE INVENTION

It has however been found out by the present inventors that the above test system for the semiconductor integrated circuit device has the following problems.

Namely, since the shift scan system and the BIST system respectively need to form a circuit (scan path) which constitutes a test function, and a test circuit inside a semiconductor integrated circuit device to be tested, a chip size increases. It is thus difficult to bring the semiconductor integrated circuit device into less size.

Further, IC tests are respectively carried out in wafer and package stages. It is also difficult to simultaneously apply a probe to electrode pads of all the chips on a wafer upon probe-used testing in the wafer stage. Therefore, a system in which each individual semiconductor chips are measured in turn, has been adopted. However, a test time becomes very long due to this system. Further, a problem arises in that since the testing of the semiconductor chips one by one causes a decrease in use efficiency of an expensive tester, cost performance is degraded and TAT (Turn Around Time) is not shortened either. Further, the speeding-up and an increase in the number of pins, which are associated with the scale down of the semiconductor integrated circuit device, has been advanced rapidly. Thus, since the usability of the expensive tester is abruptly reduced, a difficulty in investment in the tester further increases.

An object of the present invention is to provide a test technology capable of testing semiconductor chips in a short period of time without using an expensive tester.

Another object of the present invention is to provide a method of manufacturing a semiconductor integrated circuit device, which is capable of testing the semiconductor integrated circuit device without using an expensive tester, thereby making it possible to reduce the total cost necessary for testing.

A further object of the present invention is to provide a method of manufacturing a semiconductor integrated circuit device, which is capable of performing a high-accuracy test upon testing in a wafer stage, thereby shortening a timing interval required between the commencement of design of the semiconductor integrated circuit device and the completion thereof.

A still further object of the present invention is to provide a method of manufacturing a semiconductor integrated circuit device, which is capable of efficiently performing a test while controlling an increase in overhead of a test circuit used for semiconductor chips.

A still further object of the present invention is to provide a method of manufacturing a semiconductor integrated circuit device, which is capable of testing semiconductor chips without using an expensive tester and does not interfere with the post-manufacture semiconductor integrated circuit device.

The above, other objects and novel features of the present invention will become apparent from the description of the present specification and the accompanying drawings.

A summary of typical ones of the inventions disclosed in the present application will be described in brief as follows:

Namely, a test system of the present invention comprises a probe card provided with conductive needles formed in alignment with the placement of electrode pads in semiconductor chips formed on a wafer, a test circuit which is placed on the probe card and conducts tests on the semiconductor chips, based on a test program, and a control device which rewrites a test program in the test circuit and stores therein a test result outputted from the test circuit.

Further, a method of manufacturing a semiconductor integrated circuit device, according to the present invention comprises the following steps of forming a plurality of semiconductor chips each having a desired function on a semiconductor wafer, placing a test circuit connected to needles and operated in accordance with a program to test each semiconductor chip, on a probe substrate having a size corresponding to the semiconductor wafer and having the conductive needles formed thereon in alignment with the placement of electrode pads on the semiconductor chips, superimposing the probe substrate on the semiconductor wafer in such a manner that the needles are brought into contact with the corresponding electrode pads of the semiconductor chips, testing each semiconductor chip by the test circuit, and selecting a semiconductor chip judged to be non-defective, as a product.

According to the above means, since each semiconductor chip on the wafer can be tested by the test circuit placed on the probe substrate, testing can be done without using an expensive tester, thereby making it possible to reduce the total cost necessary for testing. Further, since a high-accuracy test can be carried out upon testing in a wafer stage, it is not necessary to make a test again after packaging. Alternatively, a post-packaging test can be simplified. Thus, a time interval required between the commencement of design of a semiconductor integrated circuit device and the completion thereof can be shortened.

Preferably, programmable logic ICs (FPGA) capable of configuring arbitrary logic are provided on the probe substrate in association with the respective semiconductor chips, and the test circuit is configured within each programmable logic IC based on the design data described in hardware description language, and each semiconductor chip is tested by the test circuit. Thus, since a test circuit can be configured with satisfactory efficiency, and a test circuit suitable for other semiconductor chips can be re-configured by rewriting each programmable logic IC, a probe substrate can be ordered around and the total cost can be lowered.

Further, preferably, the test circuit is used as a test signal generating circuit (ALPG) configured so as to generate a test signal to each semiconductor chip to be tested in accordance with a predetermined algorithm. Thus, a test circuit most suitable for the semiconductor chip to be tested can be configured, and testing can be done efficiently while an increase in overhead of the test circuit is being controlled.

A second method of manufacturing a semiconductor integrated circuit device, according to the present invention comprises the following steps of forming a test circuit module which is operated in accordance with a program and tests each of designed semiconductor chips, on a wafer on which the designed semiconductor chips are formed, together with the semiconductor chips, supplying a source voltage to at least the test circuit module from the outside to thereby test each semiconductor chip on the same wafer by the test circuit module, and selecting the semiconductor chip judged to be non-defective, as a product.

According to the above means, since each semiconductor chip can be tested in a wafer stage by the test circuit module formed on the wafer, testing can be done without having to use an expensive tester, and a high-accuracy test can be executed upon testing in the wafer stage. Therefore, a time interval required between the commencement of design of the semiconductor integrated circuit device and the completion thereof can be shortened.

Preferably, connections between the test circuit module and the semiconductor chips to be tested are carried out by wirings formed in a scribe area of the wafer or a test-dedicated wiring layer. Test wirings for connecting between the test circuit module and the semiconductor chips to be tested are formed within the scribe area of the wafer so as to meander. Thus, a probe substrate can be simplified in configuration, and the test wirings can reliably be cut upon dicing. Further, the post-cut remaining wirings are rendered shortest and hence a bad influence developed by the remaining wirings is avoided.

Typical ones of various inventions of the present inventions have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 7 is a diagram for describing the layout of semiconductor chips to be tested and a test circuit module employed in a further embodiment of the present invention;

FIG. 8(*a*) is a diagram showing an example of a contact between the semiconductor wafer to be tested and the probe card both employed in the further embodiment of the present invention, and FIG. 8(*b*) is an explanatory diagram showing part thereof in enlarged form;

FIG. 16 is a diagram illustrating a further example of the formation of test circuit modules on a semiconductor wafer to be tested, which is employed in a still further embodiment of the present invention;

FIG. 17(a) is a diagram showing another example of a contact between the semiconductor wafer to be tested and the probe card employed in the still further embodiment of the present invention, and FIG. 17(b) is an explanatory diagram showing part thereof in enlarged form;

DESCRIPTION OF THE PREFERRED EMBODIMENTS

Preferred embodiments of the present invention will hereinafter be described in detail with reference to the accompanying drawings.

Figure 1:
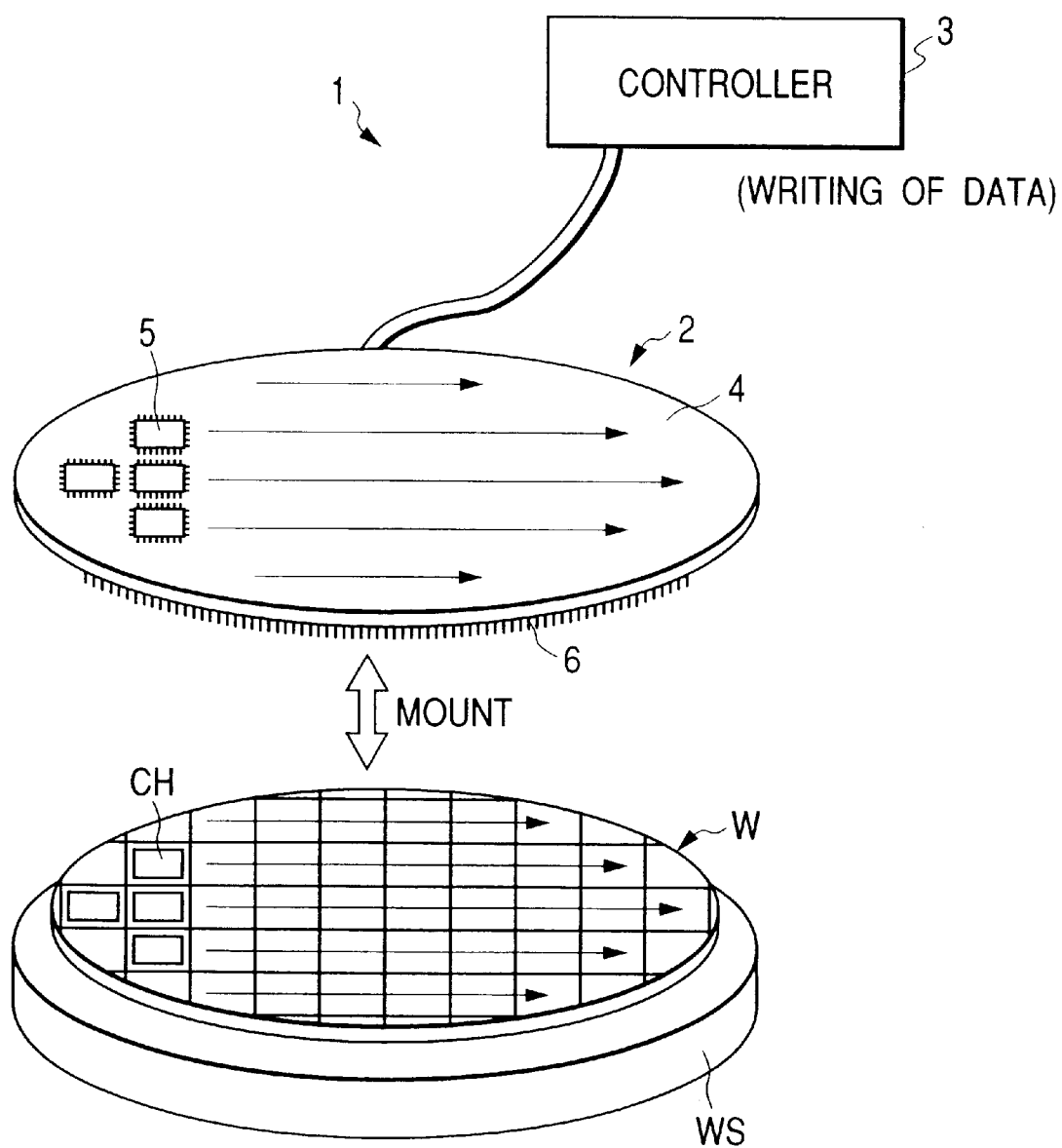
FIG. 1 is an explanatory diagram of a test system according to a first embodiment of the present invention.
Figure 2:
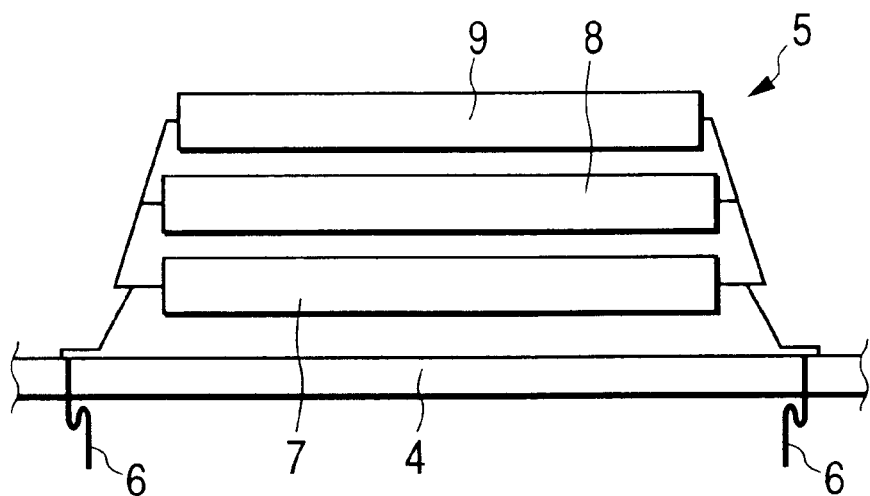
FIG. 2 is a mounting explanatory diagram of a test IC implemented on a probe card, which is employed in the first embodiment of the present invention.

FIG. 1 is an explanatory diagram showing a first embodiment of a test system to which the present invention is applied, and FIG. 2 is an explanatory diagram showing one example of a mounting structure of a test IC employed in the test system of the first embodiment.

In the present embodiment, the test system 1 comprises a probe card 2 having a size corresponding to a semiconductor wafer W, and a control device or controller 3 for controlling the probe card 2 as shown in FIG. 1. The probe card 2 includes test ICs 5 provided over an insulating substrate 4 in association with respective semiconductor chips CHs provided on the semiconductor wafer W, and needles 6 for electrically connecting the test ICs and the respective semiconductor chips CHs to the lower surface of the insulating substrate 4. The probe card 2 is configured so as to be capable of testing the semiconductor chips CHs, based on the test ICs 5. The controller 3 controls the writing of data into each test IC 5 and test operations.

The insulating substrate 4 is substantially identical to the semiconductor wafer W in size and shape. The conductive needles 6 aligned with the layout or placement of electrode pads of all the semiconductor chips CHs formed within the semiconductor wafer W over the surface opposite to the surface on which the test ICs are provided, are arranged over the insulating substrate 4. The needles 6 are formed over the entire surface of the insulating substrate 4 by technology such as a micro probe or the like. Further, wirings and through holes formed by a print wiring technology and for connecting terminals of the test ICs 5 to their corresponding needles are formed over the surface of the insulating substrate 4 and inside the substrate.

The test ICs 5 are mounted over the surface of the insulating substrate 4 in association with each individual semiconductor chips CHs on the wafer W. Each of the test ICs 5 comprises an FPGA (Field Programmable Gate Array) or the like. One having a 130K gate scale is now put on the market as the FPGA. However, when it is not sufficient for the constitution of a test circuit, one having a structure in which a plurality of FPGA 7 through 9 (three in the drawing) are mounted in laminated form as shown in FIG. 2, may be used.

In the present embodiment, the test IC 5 generates a predetermined pattern in accordance with a predetermined algorithm comprised of a microprogram written by the controller 3 based on tester construction data described in HDL (Hardware Description Language), and performs a test decision as to each semiconductor chip CH. The test IC 5 may be a semiconductor device like a microcomputer capable of understanding an HDL for a tester except for the FPGA. In this case, the microcomputer mounted to the probe card 2 is operated so as to generate an output signal in accordance with the microprogram supplied from the controller 3 and supply a predetermined test pattern to its corresponding semiconductor chip CH.

When the test IC 5 is made up of a plurality of FPGA, any of the FPGA 7 through 9 may be configured as an analog FPGA. It is thus possible to carry out even DC measurements and analytical tests such as an analog waveform characteristic analysis, etc. Even if a semiconductor integrated circuit device to be tested is a digital/analog mixed-type semiconductor integrated circuit device, it can be tested with satisfactory efficiency.

The relationship between the test circuit constructed in each test IC 5 and the HDL description for constructing the test circuit will next be described.

Figure 3:
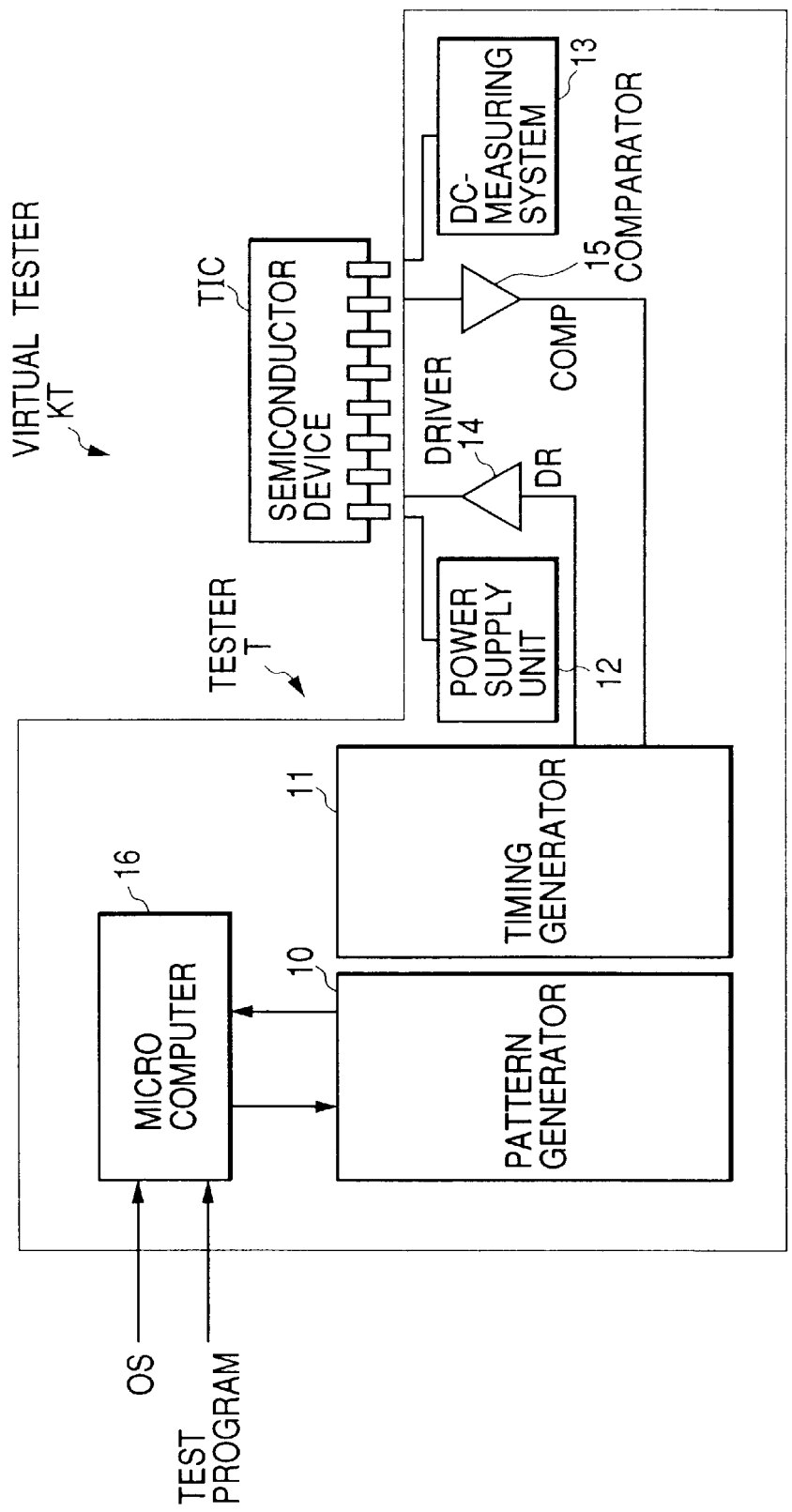
FIG. 3 is an explanatory diagram of a virtual tester employed in the first embodiment of the present invention.

FIG. 3 shows a conceptual diagram of a general tester. As shown in FIG. 3, a tester T comprises a power or source supply unit 12 for supplying a source voltage to a semiconductor integrated circuit device TIC to be tested, a driver 14 for inputting a test signal to each input pin of the semiconductor integrated circuit device TIC, a comparator 15 for making a comparison between a signal outputted from an output pin of the semiconductor integrated circuit device TIC and each of expected value signals, a pattern generator 10 for generating a signal sequence (so-called each test pattern) and an expected value signal inputted to the semiconductor integrated circuit device TIC, a timing generator 11 for generating timing provided for application of each signal inputted to the semiconductor integrated circuit device TIC, a CPU 16 used as a controller for controlling these circuits, etc.

Further, the CPU 16 is configured so as to perform the generation and determination of each test signal (so-called test pattern) while reading a test program from an external storage device and interpreting it by an OS (operating system), and carry out a predetermined test. The tester T might be provided with a DC test circuit 13 for performing a dc test such as the detection of the level of a voltage applied to the output pin of the semiconductor integrated circuit device TIC, an analog waveform generator for generating an analog waveform applied to an analog input terminal of the semiconductor integrated circuit device TIC, a waveform observer for observing a waveform outputted from the analog output terminal of the semiconductor integrated circuit device TIC, etc. Incidentally, the analog waveform generator and the waveform observer are omitted from FIG. 3.

Meanwhile, there has heretofore been known a tool called "virtual tester" for describing the functions of respective blocks 10 trough 16 of the tester T shown in FIG. 3 and the functions of the semiconductor integrated circuit device TIC to be tested, in HDL and simulating and verifying its HDL descriptive text by a hardware emulator.

The HDL descriptive text inputted to the hardware emulator can be generated by a function entry tool, for example. The function entry tool is a support tool for supporting the creation of the HDL descriptive text and converts the functions of the respective blocks of the tester T and the function of the semiconductor integrated circuit device TIC to be tested, both of which are expressed by a logic transition diagram, a flowchart or the like on the screen of a display unit of the computer, to their corresponding HDL descriptive texts. As such a function entry tool, there is known "Visual Test" provided or offered by EDA (Engineering Design Automation) Vendor like ATE Service Co., Ltd.

The virtual tester is used as a tool for logically combining the tester and the semiconductor integrated circuit device from the HDL descriptive texts generated by the function entry tool and loading the hardware emulator therewith and verifying them to thereby perform their simulation by the hardware emulator, thereby allowing debugs of a test program in a short period of time. The present inventors have obtained an idea that with a one-step progress from the technology of such a virtual tester, a tester is constructed in an FPGA from the viewpoint of the HDL description and a semiconductor integrated circuit device might be tested in a wafer state through the use of the tester, thereby leading to the development of the present invention.

In the present embodiment, the tester is made up of an ALPG (Algorithmic Memory Pattern Generator) for generating a test pattern in accordance with the known predetermined algorithm upon constructing the tester in the FPGA from the HDL descriptive text. According to the verification carried out by the present inventors, since it is known that the ALPG can be constructed of several hundreds of K gates when it is converted to the number of logic gates, the ALPG can sufficiently be constructed within the semiconductor device comprised of the several FPGA such as shown in FIG. 2.

A specific procedure for constructing the ALPG within the FPGA will now be described in brief. Constructing the ALPG within the FPGA needs to first create data for constructing the ALPG.

Upon creation of the ALPG construction data, a logic configuration of a semiconductor integrated circuit device to be tested, and a test program used in the virtual tester are analyzed and the format, i.e., schematic configuration (architecture) constructed by extracting the optimum algorithm for extracting a test pattern inputted to the semiconductor integrated circuit device to be tested is determined. For example, an algorithm corresponding to the semiconductor integrated circuit device to be tested, and the format of an ALPG for realizing it are determined as in an ALPG for generating addresses and data when the semiconductor device to be tested is a memory, and an ALPG for generating input data and expected-value data when it is a logic LSI.

The already-existing tester is commonly configured as follows. Required various test items are carried out as many as possible in such a manner that a wide variety of newly-developed semiconductor devices can be tested by a single tester. Further, the performance of each semiconductor device to be tested and the number of pins or the like in the semiconductor device are configured so as to correspond to a wide range of operating frequencies and the predicted greatest number of pins. Furthermore, the tester is provided as a high general-purpose device. Therefore, the present tester has an extremely redundant configuration. Thus, as in the present embodiment, the ALPG (test circuit) intended only for the semiconductor integrated circuit device to be tested may simply take a small-scale configuration and can hence be constructed within several FPGA.

Next, the ALPG having the determined architecture is described in HDL. However, the description of the ALPG in HDL may manually be performed by a testing engineer but can be done with satisfactory efficiency by utilizing the function entry tool called "Visual Test", for example.

Thereafter, the ALPG can be constructed within the FPGA through the use of data described in HDL. Incidentally, since a one-chip LSI (Model Number: EPF10K130E) having a 130K gate scale is provided or offered from, for example, Altera Co., Ltd. As an FPGA capable of configuring arbitrary logic, the ALPG can be constructed by using it. Since "MAX+plusII" offered from Altera Co., Ltd., for example, is known as the support tool for configuring logic within the FPGA from the HDL description, it can automatically be done by a computer through the use of it.

A description will next be made of a wafer test technique using the probe card 2 in the test system 1 shown in FIG. 1.

In the present embodiment, a wafer test is carried out upon wafer burn-in. First of all, the needles 6 of the probe card 2 are brought into contact with the electrode pads formed in each individual semiconductor chips CHs on the semiconductor wafer W placed on a wafer stage WS having a temperature control function. Pressure is applied from above the probe card 2 to press the probe card 2 against the wafer W, thereby electrically connecting the respective test ICs 5 and each individual semiconductor chips CH.

When the semiconductor chips CHs and the test ICs 5 are respectively electrically connected to one another, the controller 3 starts the supply of a source voltage. Each individual test ICs 5 supplied with the source voltage are operated in accordance with the microprogram written by the controller 3 based on the tester construction data described in HDL, and thereby generate test patterns for the corresponding semiconductor wafer W in predetermined order and apply them thereto. At this time, all the semiconductor chips CHs are simultaneously tested by the plurality of test ICs 5 provided in the probe card 2, and the result of test is sent to the controller 3 and stored in a memory provided within the controller.

The controller 3 creates a map indicative of whether the semiconductor wafer is good or bad, based on the input result of test, removes each defective product in a subsequent process (wafer dicing process), and provides data used for grade separation.

Thus, the test system according to the present embodiment is capable of collectively testing all the semiconductor chips CHs formed on the semiconductor wafer W through the use of the plurality of test ICs 5 provided in the probe card 2 upon wafer burn-in. It is therefore possible to greatly reduce a test time interval and shorten the period for the development of a product. This can be said even in the case in which the test ICs 5 are respectively replaced by microcomputer devices.

Since the FPGA is programmable, necessary tester functions can be rewritten whenever necessary by using the FPGA as the test ICs 5. Further, a change in test method, the addition thereof, etc. can easily be done. Similar operations can be done by rewriting a control program stored in an internal RAM or EEPROM or the like even when the test ICs 5 are replaced with the microcomputer devices respectively.

Further, even when a test on the entire semiconductor chip CH is complex, the semiconductor chip CH is divided into a plurality of blocks, and the optimum ALPG are reconstructed in the FPGA every blocks and the blocks may be tested in order. Thus, even when an FPGA to be used is reduced in logic scale, each semiconductor chip can be tested. Thus, the feasibility of the test ICs 5 corresponding to each individual semiconductor chips CHs on the wafer increases.

By concurrently using tests executed by the virtual tester, the evaluation of a test program by simulation and the verification of a logic function thereof can be carried out by the hardware emulator or the like before a sample for a semiconductor integrated circuit device to be tested is manufactured by way of trial. Therefore, concurrent testing can be carried out and the data used in the virtual tester can be utilized upon construction of the test circuit (ALPG) in the FPGA, whereby the test system shown in FIG. 1 can be configured with satisfactory efficiency.

Further, a self-verification type FPGA having a self-checking function, a self-recovering function, etc. disclosed in Japanese Patent Application (Japanese Patent Application No. Hei 11(1999)-122229) or the like separately proposed by the present inventors may be used as each of the test ICs 5. Thus, the test IC 5 results in a self-testable and self-recoverable structure and can be brought to a structure resistant to suffering from a defect.

Figure 4:
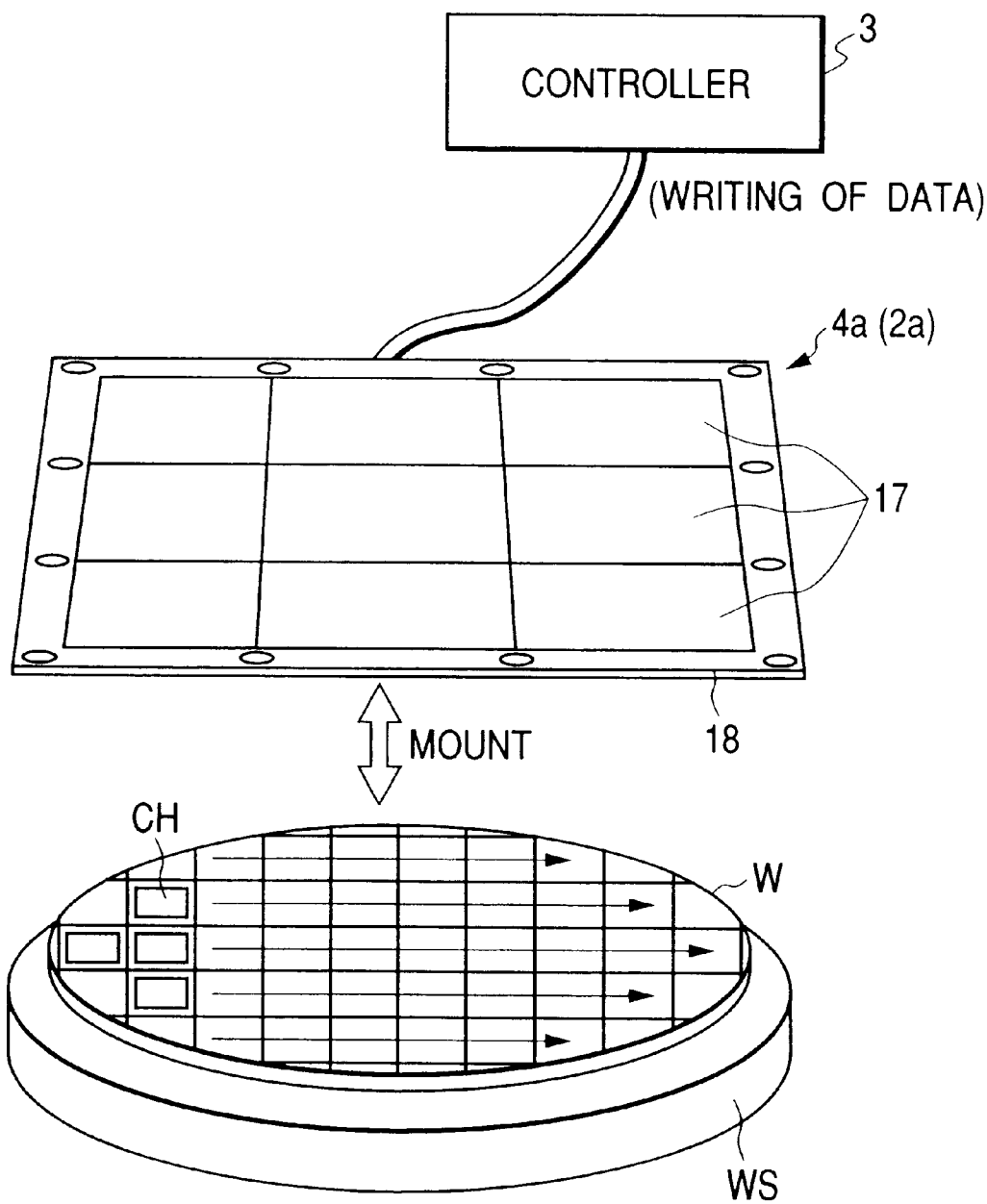
FIG. 4 is an explanatory diagram of a test system according to a second embodiment of the present invention.
Figure 5:
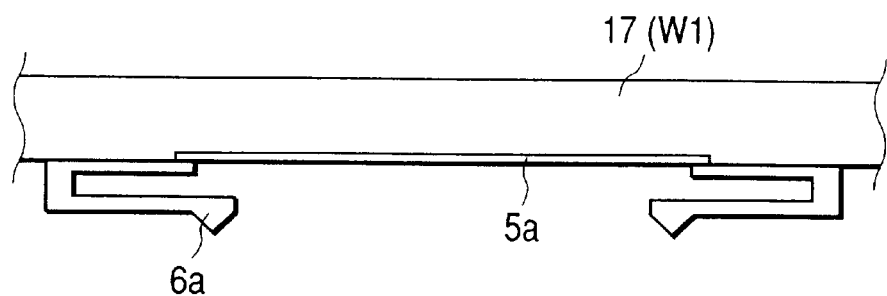
FIG. 5 is an explanatory diagram of needles and a test IC formed on a probe card employed in the second embodiment of the present invention.
Figure 6:
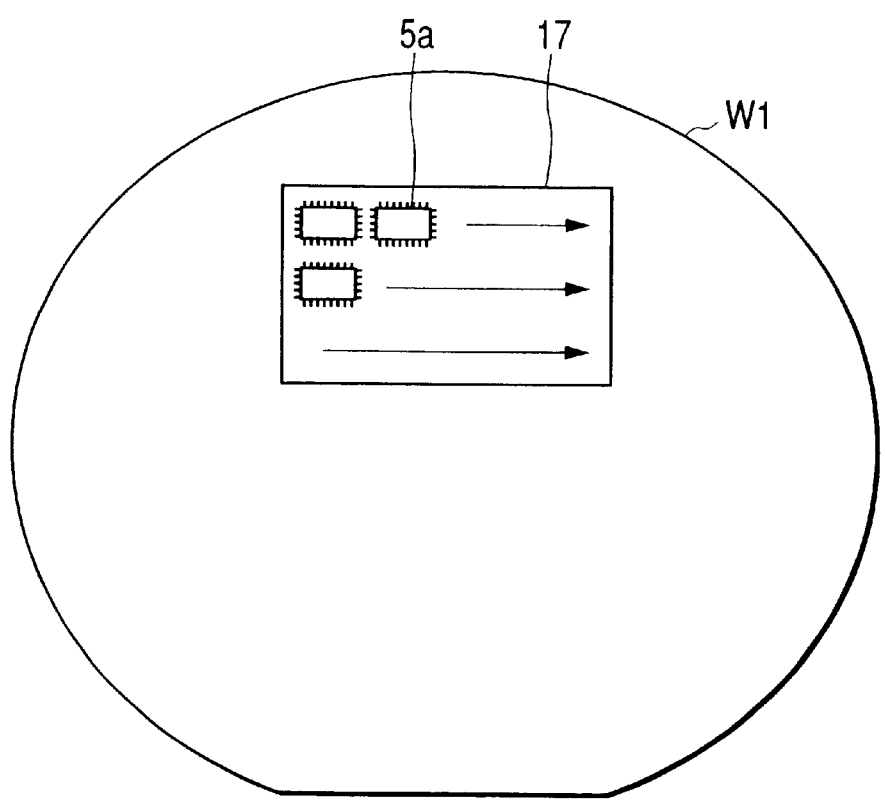
FIG. 6 is a diagram showing an example of the formation of a wafer chip which constitutes the probe card employed in the second embodiment of the present invention.

FIG. 4 is an explanatory diagram showing a second embodiment of a test system to which the present invention is applied, FIG. 5 is an explanatory diagram showing the relationship between needles and test ICs formed on a probe card employed in the test system according to the second embodiment, and FIG. 6 is a diagram showing an example of the formation of each wafer chip constituting the probe card employed in the test system according to the present embodiment, respectively.

As shown in FIG. 4, the test system 1 according to the second embodiment comprises a probe card 2a and a controller 3 in a manner similar to the first embodiment. The probe card 2a comprises a fixed frame 18 and a plurality of wafer chips 17 on which test ICs (test circuits) are formed.

Even in the case of the present embodiment, test ICs 5a each comprised of an FPGA or microcomputer device are respectively directly formed over the wafer chip 17 in association with each individual semiconductor chips CHs to be tested, as shown in FIG. 5. Needles 6a respectively brought into contact with electrode pads of the semiconductor chips CHs are provided over the surface of each wafer chip 17, which is close to each of the test ICs 5a. The needles 6a are also formed directly on the wafer chip 17 by a processing technology of a semiconductor manufacturing process.

The needles 6a are formed by a technique called silicon contact, for example. The silicon contact is a structure formed using a silicon process by a nano-tech processing technology. Each of the needles 6a formed by the silicon contact has a fine structure and is improved in contact with its corresponding electrode pad of the semiconductor chip CH to be tested. Therefore, a contact load can greatly be reduced and a wafer test can be carried out easily and reliably.

As shown in FIG. 6, the wafer chip 17 has a structure in which a semiconductor wafer W1 with test ICs 5a formed thereon (inclusive of needles 6a) is cut into rectangular shapes each having a predetermined size, and the cut plural wafer chips 17 are bonded and fixed to the fixed frame 18 comprised of aluminum in butted form.

The probe card 2a is superimposed on the semiconductor wafer W so that the needles 6a are brought into contact with their corresponding electrode pads of the respective semiconductor chips CHs on the semiconductor wafer W placed over the wafer stage WS, whereby the semiconductor chips CHs and the test ICs 5a are electrically connected to one another to perform a wafer test.

The loading of each test IC 5a with a rewritable function makes it possible to add and delete flexible test items. As to test patterns, test circuits are configured so as to form the test patterns every pins to thereby utilize pattern compression. As a result, a control program to be written into each test IC 5a becomes short and is also easily rewritten. Thus, when testing is made using the probe card 2a shown in FIG. 4, the rewriting of some of a control program can cope with a plurality of semiconductor chips without creating a plurality of test ICs and control programs, whereby it becomes wide application.

According to the second embodiment, the probe card 2a is made up of the plurality of wafer chips 17. Thus, the wafer chip 17 corresponding to the portion good in performance can be cut out of the plurality of semiconductor wafer W1 to form each probe card 2a. It is therefore possible to greatly improve reliability. Even when a large-diameter wafer is tested, an increase in the number of the wafer chips 17 can flexibly cope with it. Further, each wafer chip 17, which constitutes the test IC, can be formed over the wafer smaller in diameter than the wafer W on which the semiconductor integrated circuit device to be tested is formed.

Further, the plurality of wafer chips 17 are utilized in combination to configure the probe card 2a in the above description. However, a plurality of test ICs 5a corresponding to each individual semiconductor chips CHs of a semiconductor wafer W to be tested are formed over a semiconductor wafer W1 distinct from the semiconductor wafer W to be tested, as shown in FIG. 7 and FIGS. 8(a) and 8(b) by way of example. Thereafter, the semiconductor wafer W1 itself may be used as a probe card 2a.

In this case, needles 6b are respectively formed at positions corresponding to electrode pads of each individual semiconductor chips CHs to be tested, on the semiconductor wafer W1 with the test ICs 5a formed thereon. The needles 6b can be comprised of such bumps B or the like as shown in FIG. 8(b) by way of example. Upon a wafer test, a main surface of the semiconductor wafer W and a main surface of the semiconductor wafer W1 defined as a probe card 4b are superimposed on each other to thereby bring the needles 6b comprised of the bumps B and the electrode pads of the semiconductor chips CHs into contact with one another respectively. It is thus possible to improve use durability.

Even in the case of the second embodiment, if a self-verification FPGA having a self-checking function, a self-recovering function, etc. is used as each of the test ICs 5a, it can be brought to a structure resistant to suffering from a defect.

A test system can be implemented wherein when a non-recoverable test IC 5a exists in the probe card 2a, the unrecoverable state thereof is recorded in its corresponding test IC 5a, and a substitution test function is automatically assigned to a test IC closest to the test IC 5a, whereby IC examinations can be carried out without depending on yields and failures of the test ICs 5a.

Figure 9A:
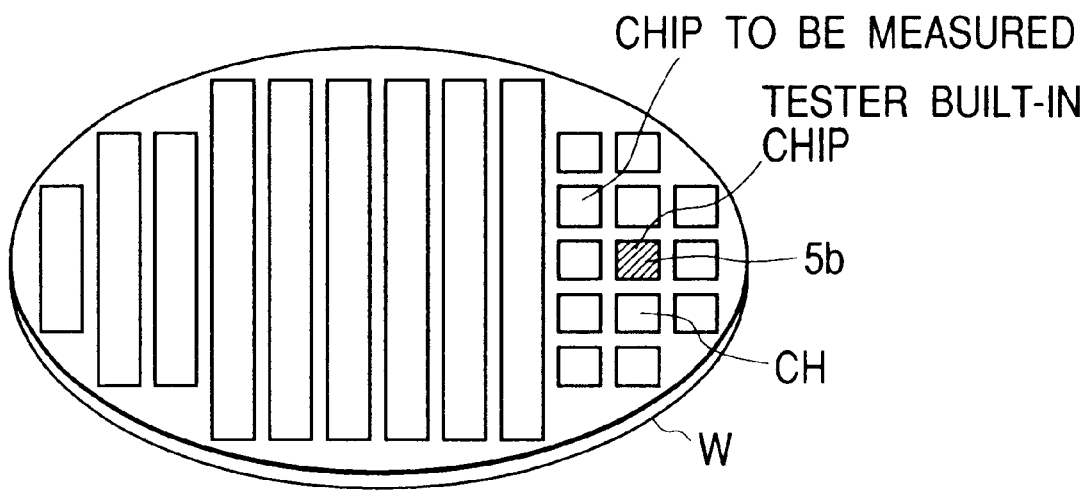
FIG. 9(*a*) is a diagram illustrating an example of the layout of a test circuit module formed on a semiconductor wafer employed in a third embodiment of the present invention, and FIG. 9(*b*) is an explanatory diagram of a probing module.
Figure 9B:
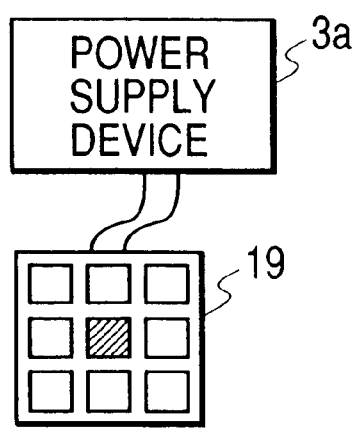
Figure 10:
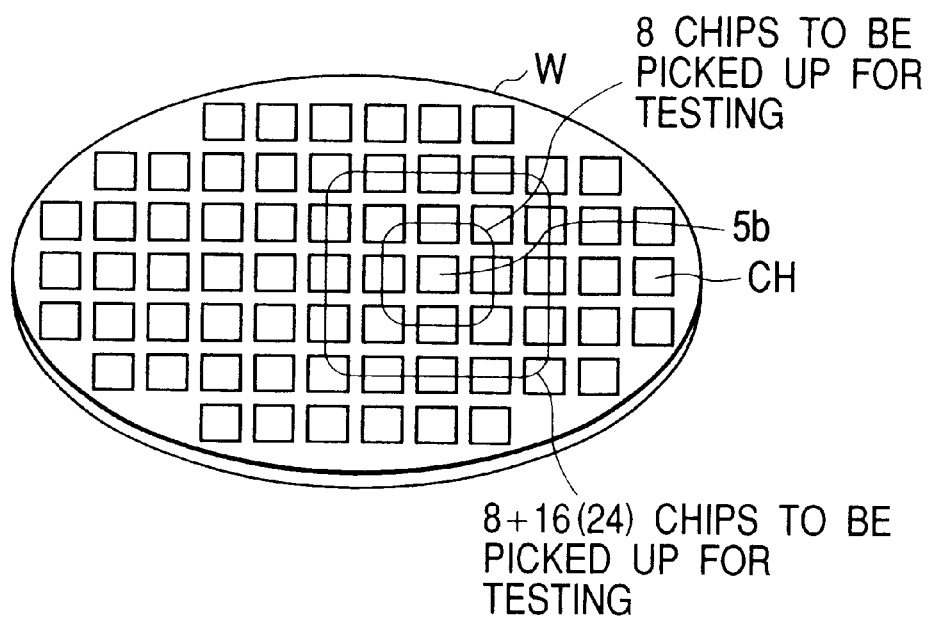
FIG. 10 is an explanatory diagram of a test measuring range of a tester employed in the third embodiment of the present invention.

FIG. 9(a) is a diagram illustrating an example of the layout of test ICs formed on a semiconductor wafer under the application of a third embodiment of the present invention thereto, FIG. 9(b) is an explanatory diagram of a probing module employed in the third embodiment, and FIG. 10 is an explanatory diagram of a test measuring range of a tester employed in the third embodiment, respectively.

In the present embodiment, a test system 1 comprises test ICs 5b formed over a semiconductor wafer, a probing module 19 and a power supply device 3a. As shown in FIG. 9(a), the test ICs 5b or chips with the test ICs (test circuits) 5b formed therein are placed at predetermined intervals in suitable positions on the same semiconductor wafer W as a semiconductor wafer in which semiconductor chips CHs used as products are fabricated and incorporated.

The semiconductor chips CHs around each test IC 5b formed over the same wafer in this way are tested through the test IC 5b. As shown in FIG. 10 by way of example, eight semiconductor chips lying around each test IC 5b, or twenty-four semiconductor chips CHs equal to the sum of these eight semiconductor chips and sixteen semiconductor chips which surround these, are tested at a time.

In the present embodiment, the electrical connections between these tested semiconductor chips CHs and the test ICs 5b are made by the probing module 19 shown in FIG. 9(b). The probing module 19 is wired and needles are provided on the surface thereof. Further, the needles are brought into contact with electrode pads of the semiconductor chips CH formed on the semiconductor wafer and electrode pad of each test IC 5b, thereby connecting each individual semiconductor chips CHs and the test IC 5b through the wirings of the probing module 19.

The power supply device 3a supplies a source voltage to the test IC 5b on the wafer W and the tested semiconductor chips placed therearound through the probing module 19 to start a wafer test. When the source voltage is applied thereto from the power supply device 3a, the test IC 5b outputs a test signal to each semiconductor chip CH to be measured. Further, the number of the tested semiconductor chips CHs, voltage drops developed due to the placement or layout of analog circuits, which are measured through a Kelvin circuit, etc. are stored as information about the respective semiconductor chips CHs. Each individual test items are automatically sequentially executed based on the information.

As a result of the execution of the test, signals outputted from the respective semiconductor chips CHs are supplied to the test IC 5b and compared with data stored in a memory provided inside the test IC 5b or compared with expected-value data generated by the test IC 5, whereby it is determined whether each semiconductor chip is good or bad. If it is found to be defective, then processing is effected on the test IC 5b so that the corresponding defective semiconductor chip CH be determinable from its external appearance.

A method of, for example, allowing overcurrent to flow in a partial aluminum wiring or polysilicon wiring or the like of the defective semiconductor chip CH to cut off it, or changing the color of thermal-denaturing coloring agent applied to its periphery by utilizing high heat developed by allowing current to flow in a zener zap. Thus, the testing is completed by simply applying the source voltage to each chip on the wafer through the probing module. As a result, such a mark that each semiconductor chip CH is found to be defective from the external appearance, is placed thereon. It is therefore possible to easily make a decision as to each semiconductor chip CH.

In the third embodiment as described above, each test IC 5b s formed on the semiconductor wafer W to thereby make it possible to simplify the configuration on the probe card side, and the test device can greatly reduced in cost and space. Further, since the test IC 5b is fabricated in the same process as each semiconductor chip CH obtained as the product, it is possible to reduce a circuit scale or area and greatly reduce overhead of the semiconductor wafer W. Namely, since the conventional tester comprises a semiconductor integrated circuit device manufactured by the process technology prior to a generation or two, which is low in integration degree as compared with the semiconductor integrated circuit device to be tested, a circuit scale thereof would increase inevitably. However, since each test IC 5b can be formed by the latest process technology when the present embodiment is applied as an alternative, the circuit scale of the test device can greatly be reduced.

On the other hand, the conventional test device has needed a long signal wiring (cable) for connecting a probe card and a tester body. However, since such a signal wiring becomes unnecessary in the present embodiment and the distance between the test IC 5b and each semiconductor chip to be tested is short, wiring stray capacitance is minimized and a high-speed clock actual operation test or the like can stably be performed. When the present embodiment is applied to a test system for a high-frequency semiconductor integrated circuit device, the superiority thereof can further be exhibited.

Further, since the application of the present embodiment allows the execution of tests on respective chips while aging (called "burn-in") is being performed in a state of the semiconductor wafer W, the period from the commencement of the development of the semiconductor integrated circuit device to the shipment thereof can greatly be shortened.

Figure 18:
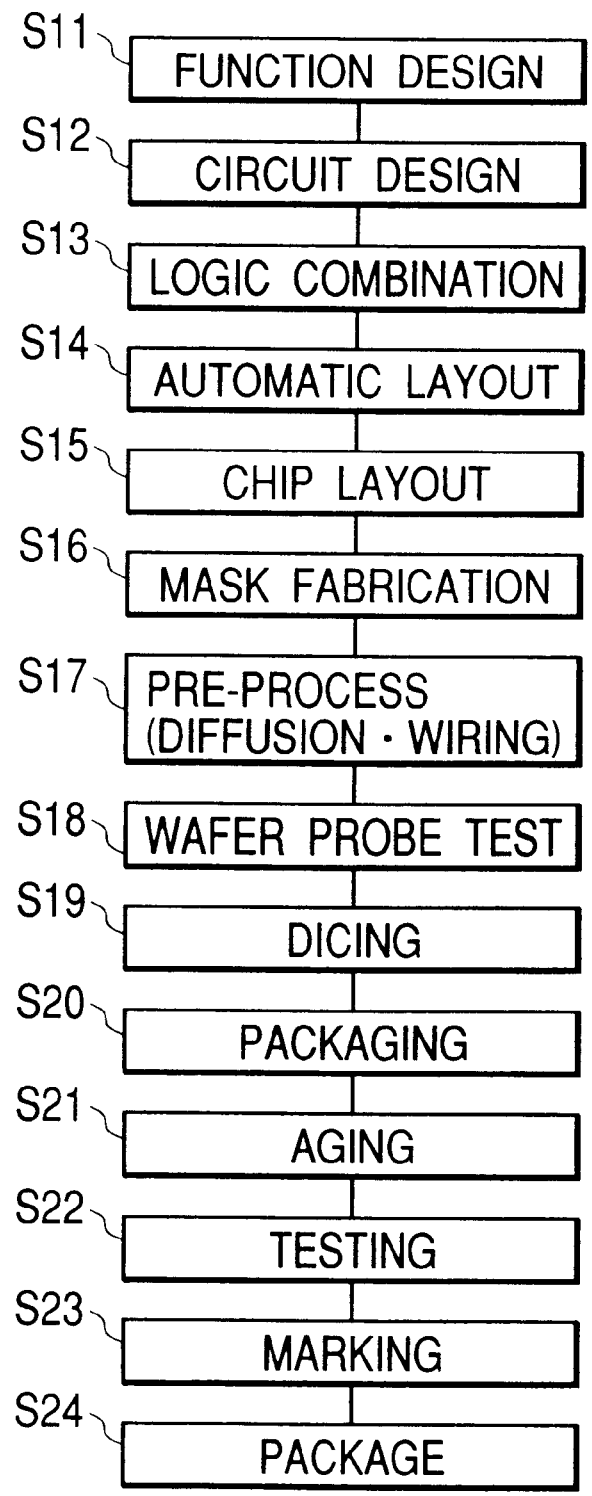
FIG. 18 is a flowchart showing a process of going from the commencement of the development of a semiconductor integrated circuit device to its shipment when a conventional tester is used.
Figure 19:
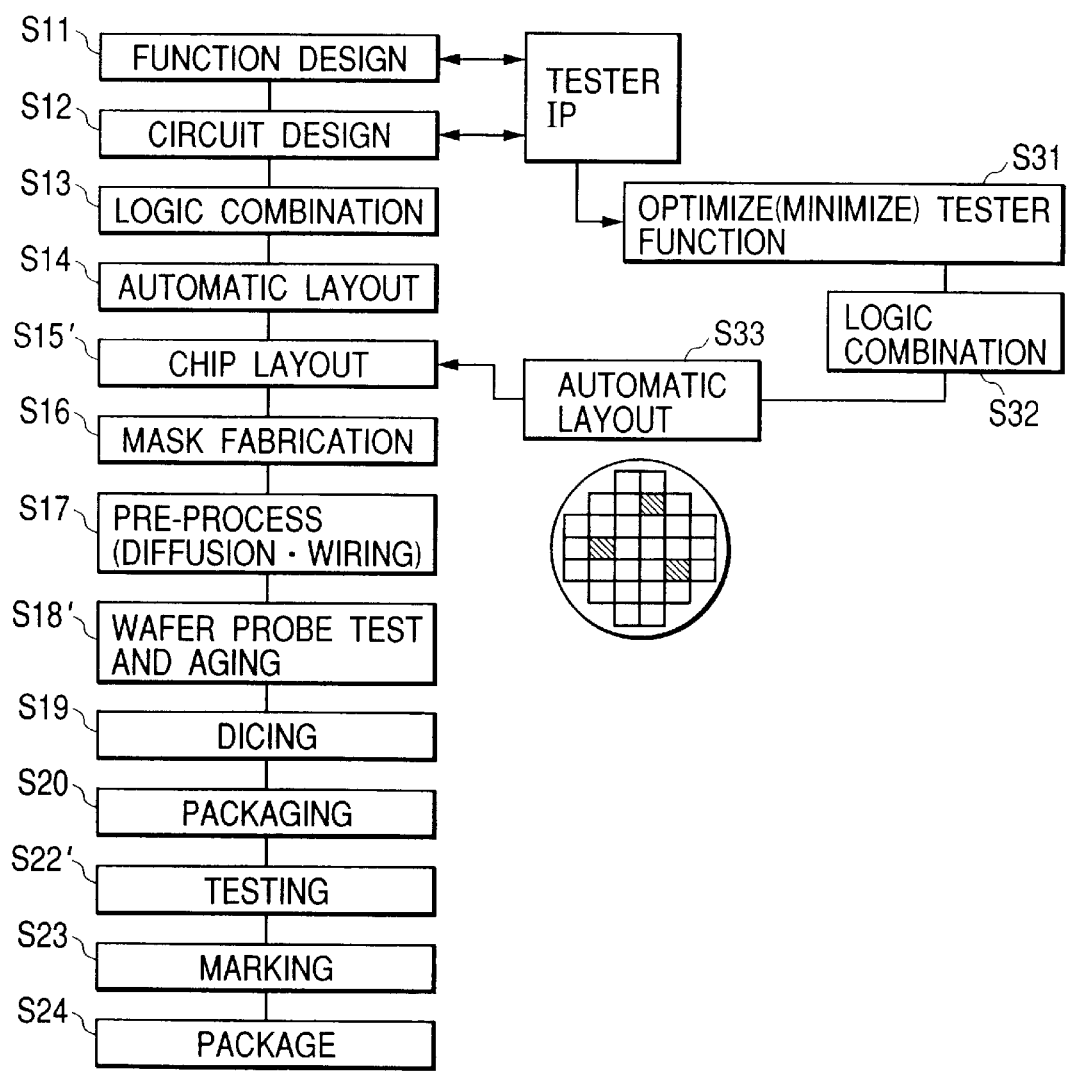
FIG. 19 is a flowchart illustrating a process of going from the commencement of the development of a semiconductor integrated circuit device to its shipment when a test system according to an embodiment of the present invention is applied.

The availability of the present embodiment will be described below while a process from the commencement of the development of the semiconductor integrated circuit device to the shipment thereof where the test system according to the present embodiment is applied, is being compared with a process from the commencement of the development of the semiconductor integrated circuit device to the shipment thereof where the conventional tester is used. FIG. 18 shows the process from the commencement of the development of the semiconductor integrated circuit device to the shipment thereof where the conventional tester is used. FIG. 19 shows the process from the commencement of the development of the semiconductor integrated circuit to the shipment thereof where the test system according to the present embodiment is applied.

As shown in FIG. 18, the conventional semiconductor integrated circuit device is developed as follows: A logic function of a semiconductor integrated circuit to be developed is first designed (Step S11). The logic function design is commonly carried out using HDL. Incidentally, since the support tool (program) for automatically creating the HDL descriptive text from the state transition diagram and the flowchart is offered from the EDA Vendor, HDL description can be carried out through the use of it with satisfactory efficiency. A virtual test for verifying the suitability of operation is effected on HDL-described data in accordance with a verifying program for generating a test pattern called "test vector". When a defective condition is found from the virtual test, the HDL descriptive text is modified or corrected.

Next, a circuit having a logic gate level is designed based on the data designed in Step S11 (Step S12). Described specifically, logic gates, which constitute a circuit having a desired function, and a cell like a flip-flop are designed. A logic combination is performed based on the designed data, and design data obtained by describing information about connections between the respective logic gates and the cell in the form of a net list is created (Step S13). When a desired logic function is provided on an LSI in which the circuit design of each logic gate has already been carried out, as in the case of a gate array or the like, the circuit design in Step S12 can be omitted. Since a program called logic combining tool for converting the HDL-described design data to design data of a logic gate level and combining the same together is offered from the EDA Vendor even here, the HDL description can be done using it. Further, the generated design data of logic gate level is verified again by the test vector (virtual tester). When a defective condition is found out by the virtual tester, the design data of the logic gate level is modified.

Next, layout data of a device level is generated according to a program called "automatic layout tool" based on the design data of the logic gate level, described in the net list format (Step S14). Such an automatic layout tool is also offered from a plurality of EDA vendors. Thereafter, the layout of each chip on a wafer is determined (Step S15). Further, mask pattern data is generated according to art work, based on data about the determined layout, and a mask is fabricated based on the mask pattern data (Step S16).

Thereafter, processes such as a diffusing process, wiring pattern formation, etc. are effected on the semiconductor wafer according to a pre-process to thereby form a semiconductor integrated circuit thereon (Step S17). Then, a probe test for bringing a tip probe of a cable extending from a tester into contact with an electrode pad of each chip, inputting a test pattern and observing an output is performed (Step S18). When the probe test is finished, a dicing for dividing the wafer into each individual chips is carried out (Step S19).

The divided chips are enclosed or encapsulated in a package with a sealant such as a resin (Step S20). At this time, each chip judged to be defective by the probe test in Step S18 is removed in advance. Then, the semiconductor integrated circuit device kept in a packaged state is placed under a high temperature by an aging (or burn-in) device and thereafter tested again by the tester in the packaged state (Steps S21 and S22). The contents of the test at this time is substantially identical to the contents of the probe test executed in Step S18. As to ones judged to be defective in this test, markings are placed on their package surfaces (Step S23). They are removed in a sorting process, and only non-defectives are packaged and shipped (Step S24).

FIG. 19 shows a process of going from the commencement of the development of a semiconductor integrated circuit device to its shipment where the test system according to the above embodiment is applied, i.e., a procedure used for a method of manufacturing the semiconductor integrated circuit device according to the present invention. As is apparent as compared with FIG. 18, Steps S11 through S14 are the same as ever.

In the process of the present invention, however, functions necessary for tests on a semiconductor integrated circuit device being under development are determined, i.e., tester functions are optimized using data (tester IP) used in the virtual test executed in Steps S11 and S12 on a parallel with the function design (Step S11), circuit design (Step S12), logic combination (Step S13) and automatic layout (Step S14) of the semiconductor integrated circuit device placed under development (Step S31).

As described in the above-described embodiment, the tester functions are described in HDL (Step S32). In a manner similar to the semiconductor integrated circuit device to be developed, a logic combination of a test circuit (ALPG) is performed from the HDL description using a logic combination tool and thereby conversion to design data having a logic gate level is carried out (Step S33). Then, layout data having a device level is generated by an automatic layout tool, based on the generated design data of logic gate level (Step S34).

Thus, when the layout data for the tester circuit is generated, a chip layout in which each semiconductor chip and a test circuit module developed on a wafer are arranged in predetermined positions, is determined to form the present test circuit on the wafer as a module (Step S15'). At this time, the test circuit module is placed in the proportions of 1 to 8 or 1 to 24 other than in a 1 to 1 proportion to each semiconductor chip to be tested.

Mask pattern data is generated inclusive of the test circuit module according to art work, based on the determined layout data, and a mask is fabricated based on the mask pattern data (Step S16').

Thereafter, processes such as a diffusing process, wiring pattern formation, etc. are effected on the semiconductor wafer according to a pre-process to thereby form a semiconductor integrated circuit and a test circuit module thereon (Step S17). In the process of the present invention, a probe card or probing module for supplying power and connecting the test circuit module and each semiconductor chip is brought into contact with the test circuit module and an electrode pad of each semiconductor chip on the wafer to thereby automatically perform a test on each semiconductor chip by the test circuit module on the wafer (Step S18'). Further, the present wafer test is performed within the aging device in the present embodiment.

When the test is finished, a dicing for dividing the wafer into each individual chips is carried out (Step S19). Thereafter, the divided chips are enclosed or encapsulated in a package with a sealant such as a resin (Step S20). At this time, each chip judged to be defective by the probe test in Step S18 is removed. Then, the semiconductor integrated circuit device kept in a packaged state is tested by a tester (Step S22'). As the test at this time, only a simple test like a DC test, which was not done in Step S18', is included. As to ones judged to be defective in this test, markings are placed on their package surfaces (Step S23) They are removed in a sorting process, and only non-defectives are packaged and shipped (Step S24). When the test circuit module on the wafer has even a DC test function, the test done by the tester in Step S22' may be omitted.

Thus, since the tests, which have heretofore been executed in the wafer and package states, can be handled at one try in the process of the present invention, a development period from mechanical design to the shipment of each product can be shortened. Further, since it is necessary to carry out the wafer test and the package test in the conventional process when a defective one is found out in the package test and a design change is required, TAT becomes so long. Since, however, only the wafer test may be done in the process of the present invention as the test even if the design change occurs, TAT is also greatly shortened.

Further, in the third embodiment, the test circuit module 5b is formed on the semiconductor wafer W on which each semiconductor chip to be tested is formed, and the test circuit module 5b and each semiconductor chip CH are connected to one another by the probing module 19. However, test wirings for connecting a test circuit module 5b and semiconductor chips CHs may be formed in each scribe area SA between chips CHs on a semiconductor wafer W shown in FIG. 11 by way of example.

On the other hand, when the respective semiconductor chips CHs are cut separately along the scribe area SA by dicing where the test wirings are formed in the scribe area SA, the wirings provided so as to extend along the far outer side as viewed from the center line of the scribe area SA might be left as they are without being cut off. When such wirings still remains, they serve as antennas and pick up electromagnetic noise. It is thus expected that the noise is apt to enter into an internal circuit from the electrode pad of each chip.

Figure 12:
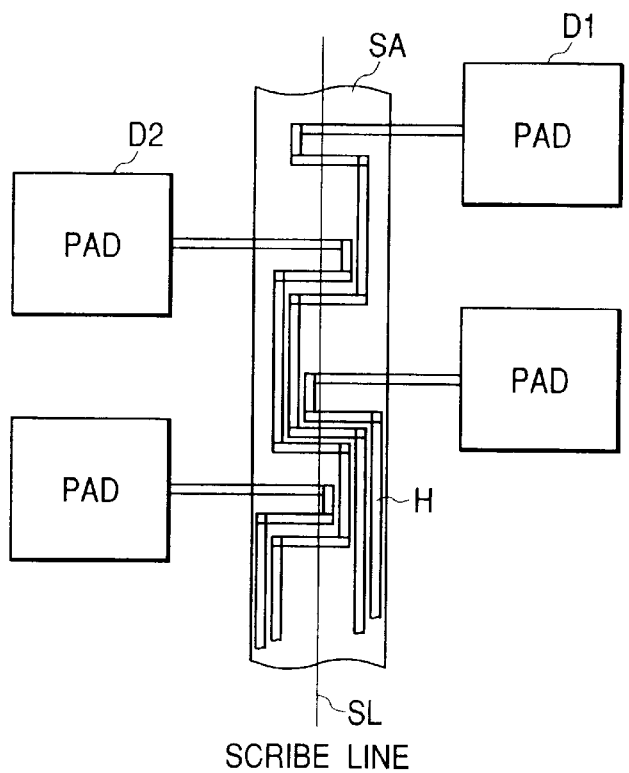
FIG. 12 is an explanatory diagram depicting one example illustrative of wirings formed on a scribe area of a semiconductor wafer, which connect a test circuit module and each semiconductor chip both employed in a still further embodiment of the present invention.
Figure 13:
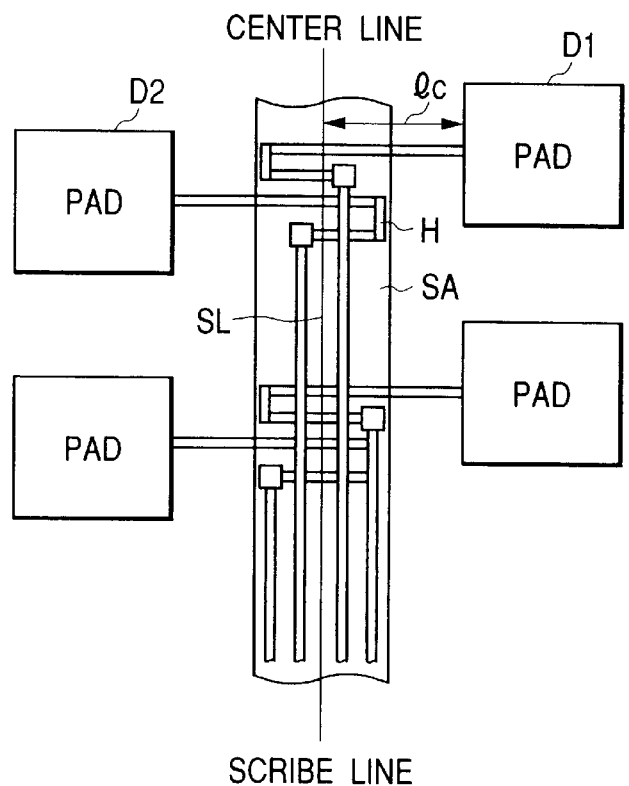
FIG. 13 is an explanatory diagram showing another example illustrative of wirings formed on a scribe area of a semiconductor wafer, which connect a test circuit module and each semiconductor chip both employed in a still further embodiment of the present invention.

FIGS. 12 and 13 respectively show contrived configurations for lessening an influence caused by such residual wirings in the scribe area SA. Of these, FIG. 12 shows a layout example effective for application to test wirings H formed by one layer wiring. FIG. 13 shows a layout example effective for application to test wirings H formed by two-layer wiring.

As shown in FIGS. 12 and 13, the test wirings H are arranged in meandering form so as straddle a scribe line SL used as the center line of the scribed area SA again and again. Thus, the test wirings H are always cut upon dicing of the semiconductor chips CH. Further, the length 1c of each residual wiring extending to the scribe area SA from each electrode pad PAD of one chip becomes equal to a distance to the center line of the scribe area SA. The test wiring is cut so as to remain in the shortest length.

Figure 20:
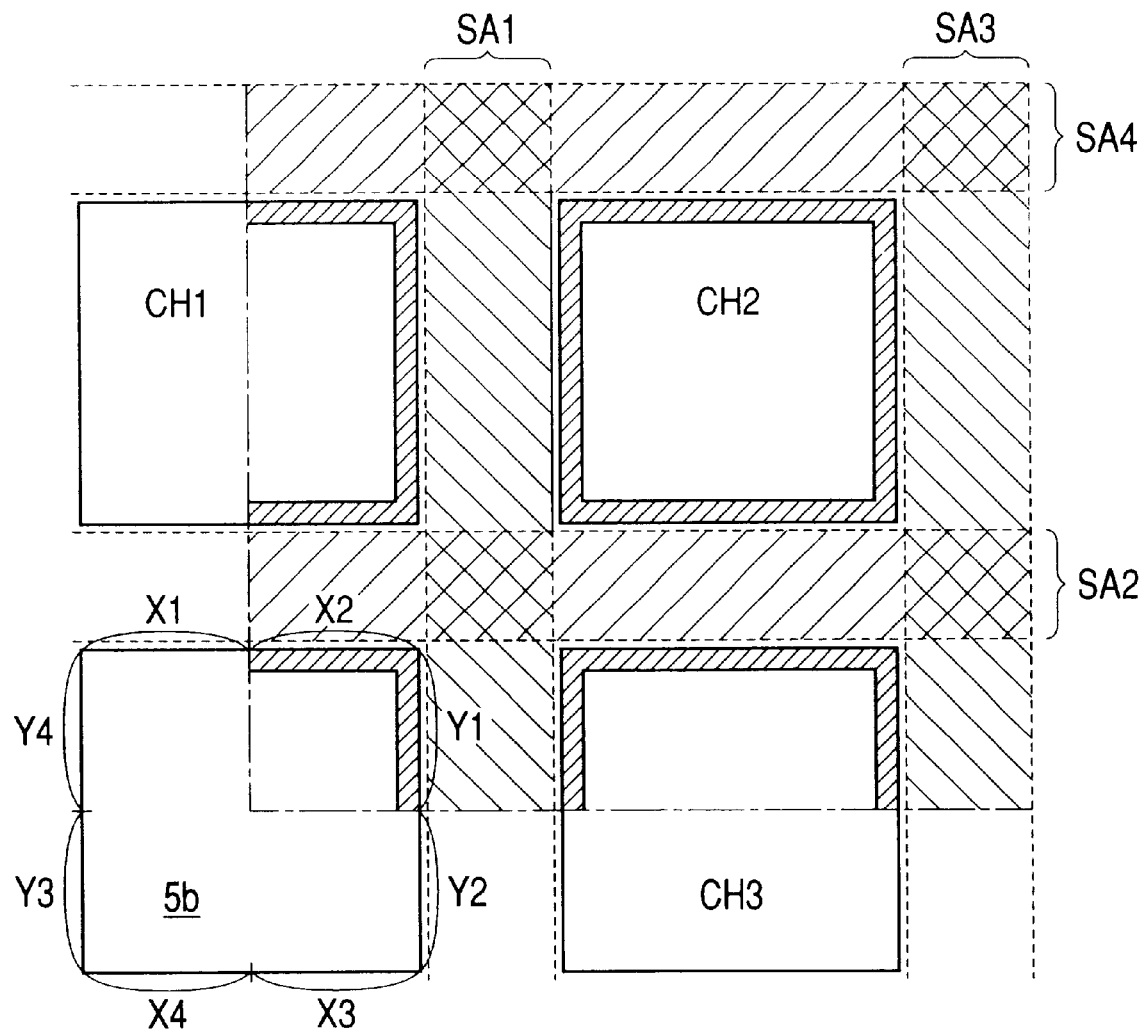
FIG. 20 is a layout explanatory diagram showing a wiring connecting system relatively satisfactory in efficiency where one test circuit module tests semiconductor chips provided therearound.
Figure 21:
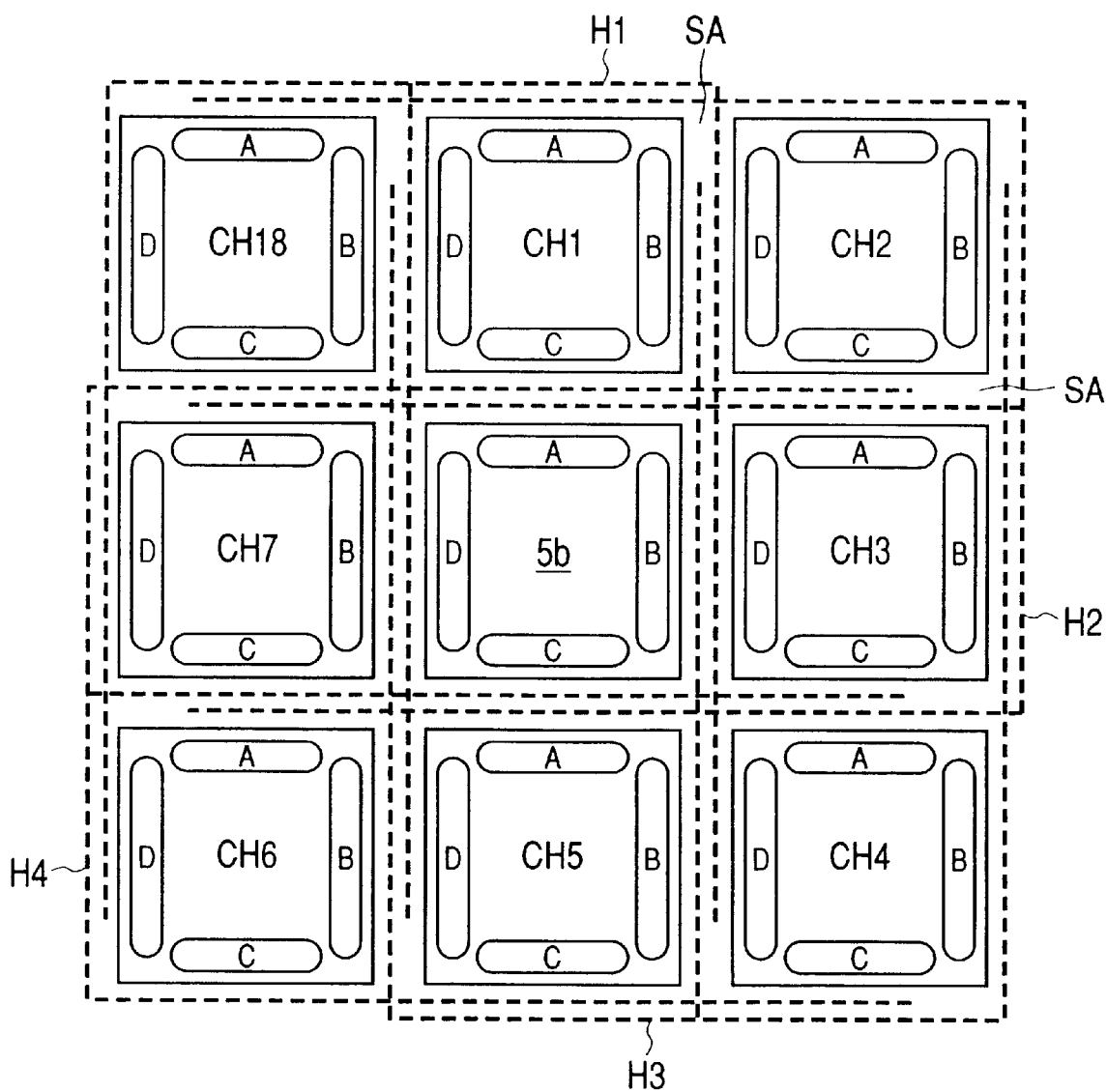
FIG. 21 is a layout explanatory diagram illustrating one example of a wiring connecting system relatively satisfactory in efficiency where one test circuit module tests eight semiconductor chips provided therearound.

FIGS. 20 and 21 respectively show wiring connecting systems relatively good in efficiency where eight semiconductor chips CHs lying around a test circuit module are tested by the test circuit module. Of these, FIG. 20 shows the case in which test wirings H are formed by one layer wiring. In FIG. 20, reference numeral 5b indicates a test circuit module, and CH1, CH2 and CH3 respectively indicate three of the eight semiconductor chips provided therearound.

FIG. 20 shows that the four sides of the test circuit module 5b are respectively divided into two, terminals connected to all electrode pads provided around the right half of the adjacent chip CH1, all electrode pads provided on all the peripheries of the chip CH2, and all electrode pads provided around the left half of the chip CH3 are provided with respect to half sides X2 and Y1 at the upper right corner of the test circuit module 5b, and test wirings for connecting those terminals and the selected electrode pads of the chips CH1, CH2 and CH3 through the use of scribe areas SA1, SA2, SA3 and SA4 are formed. It is not necessary to provide ones other than a terminal supplied with a source voltage, of terminals provided at the four sides of the test circuit module 5b as electrode pads. They are used as virtual terminals to which one ends of test wirings formed in the scribe areas SA1, SA2, SA3 and SA4 are connected. Thus, the terminals can closely be placed around the four sides of the test circuit module 5b as compared with each semiconductor chip to be tested.

The five chips other than the chips CH1, CH2 and CH3 are also set in a manner similar to the above: Terminals connected to electrode pads at portions similar to the above, of the adjacent three chips are respectively provided with respect to half sides Y2 and X3; X4 and Y3; and Y4 and X1 at the three corners of the test circuit module 5b, and they are connected to one another through test wirings formed in scribe areas. Thus, the test wirings relatively short in length allow electrical connections between one test circuit module and the eight semiconductor chips provided therearound.

On the other hand, when such a connecting system as shown in FIG. 20 is adopted, the test wirings become closest at a portion corresponding to a diagonal line DL for connecting opposite corners of the chips CH1 and CH3. Thus, a calculation is made as to whether all the wirings desired to pass through the width of the portion fall within the width of the portion at allowed pitches. If the wirings do not fall therewithin, then such a two layer wiring system as shown in FIG. 21 may be selected.

In FIG. 21, reference numeral 5b indicates a test circuit module, CH1 through CH8 respectively indicate eight semiconductor chips provided around the test circuit module 5b, H1 through H4 respectively indicate test wirings for connecting the test circuit module 5b and the semiconductor chips CH1 through CH8, and A through D respectively indicate electrode pads. Incidentally, the electrode pads identified by the same reference numerals means that they are connected to the same test wirings respectively. While the test wirings H1 through H4 are represented so as to extend along the peripheries of the respective chips for convenience of illustration in FIG. 21, they are placed in a scribe area SA upon their actual layout.

Referring to FIG. 21, the test wirings disposed in the scribe area SA comprise four fork-shaped wiring bodies H1, H2, H3 and H4 each comprised of three tooth portions, and coupling portions orthogonal to them and for coupling them. These four fork-shaped wiring bodies H1, H2, H3 and H4 are arranged in such a manner that their tooth portions enter into the scribe area SA represented in a chip matrix from four directions different 90° from one another, and teeth of the opposite wiring bodies engage with one another. Further, the respective chips CH1 through CH8 are arranged in such a way that the four sides thereof are surrounded by any tooth portion of these fork-shaped wiring bodies H1, H2, H3 and H4. The respective chips CH1 through CH8 and the electrode pads A, B, C and D of the test circuit module 5b are respectively connected to wirings for the tooth portions of the fork-shaped wiring bodies H1, H2, H3 and H4 disposed along their sides.

In the four fork-shaped wiring bodies H1, H2, H3 and H4, the parallel tooth portions thereof are respectively formed of wirings each placed in the same layer, and the orthogonal tooth portions are formed of wirings placed in different layers. Described specifically, the fork-shaped wiring bodies H1 and H3 are formed of the wirings corresponding to the first layer, whereas the fork-shaped wiring bodies H2 and H4 are formed of the wirings corresponding to the second layer. Thus, they are respectively brought to an electrically-insulated state at portions which intersect each other.

The electrical connections between the test circuit module 5b and the eight semiconductor chips CH1 through CH8 provided therearound by the fork-shaped wiring bodies H1, H2, H3 and H4 in the above-described manner allow a reduction in the number of the wirings and permits electrical connections using a scribe line relatively narrow in width. However, the connecting system shown in FIG. 21 is of a bus system and a plurality of chips are connected to one wiring. It is therefore necessary to perform such control as to send a chip select signal to each of the respective semiconductor chips CH1 through CH8 through the test circuit module 5b to thereby connect any of the chips to the test circuit module 5b within a given time zone, and perform tests in turn according to a time-division system.

Figure 22:
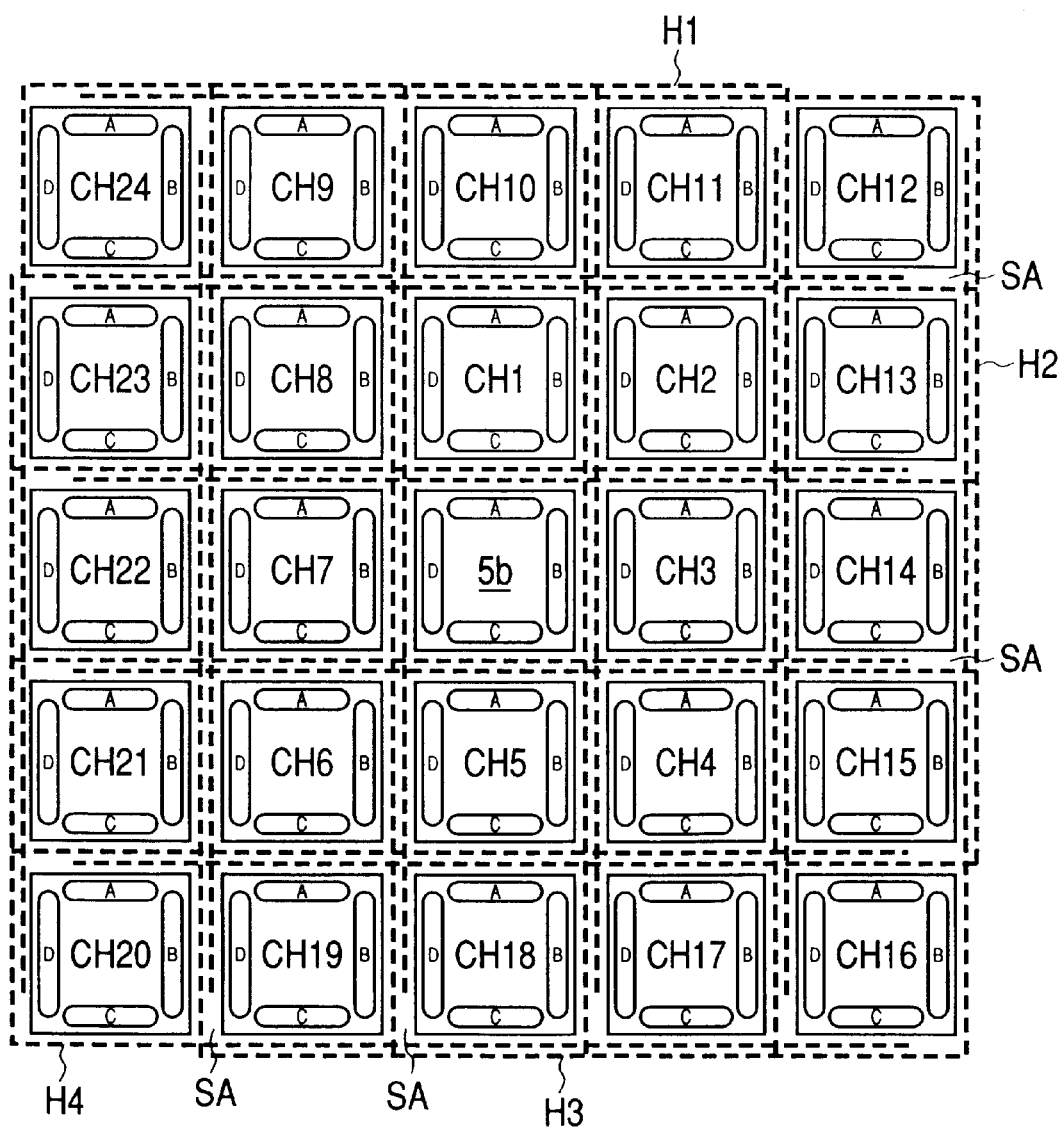
FIG. 22 is a layout explanatory diagram showing another example of a wiring connecting system relatively satisfactory in efficiency where one test circuit module tests twenty-four semiconductor chips provided therearound.

FIG. 22 shows a wiring connecting system considered to be best in efficiency where a test circuit module 5b and semiconductor chips CH1 through CH24 provided therearound are connected to one another in an embodiment wherein the twenty-four semiconductor chips CH1 through CH24 are tested by one test circuit module 5b. The present system is one in which the system shown in FIG. 21 has increased in scale, and is identical thereto in way of basic configuration. Namely, the electrical connections between the test circuit module 5b and the twenty-four semiconductor chips CH1 through CH24 are carried out by four fork-shaped wiring bodies H1, H2, H3 and H4 in a manner similar to the system shown in FIG. 21. The present system is different from that shown in FIG. 21 in that tooth portions are provided for the fork-shaped wiring bodies H1, H2, H3 and H4 five by five without being provided three by three. Even in the present embodiment, the chips CH1 through CH24 and electrode pads A, B, C and D of the test circuit module 5b are respectively connected to wirings at the tooth portions of the fork-shaped wiring bodies H1, H2, H3 and H4 arranged along their sides.

Figure 11:
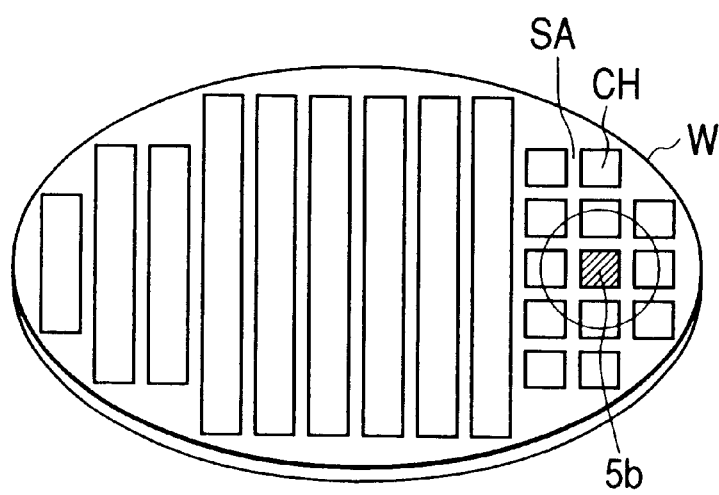
FIG. 11 is a diagram showing an example of the formation of a test circuit module on a semiconductor wafer to be tested, which is employed in a still further embodiment of the present invention.
Figure 14:
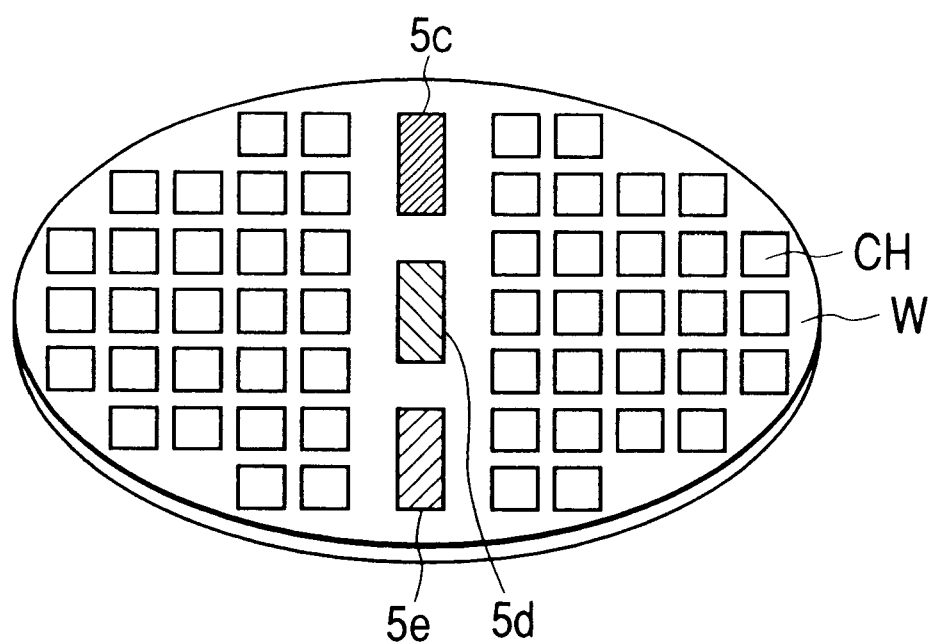
FIG. 14 is a diagram illustrating one example of the formation of test circuit modules on a semiconductor wafer to be tested, which is employed in a still further embodiment of the present invention.

The layout of the test circuit module and the tested semiconductor chips on the wafer is not limited to the examples shown in FIGS. 10 and 11. As shown in FIG. 14 by way of example, a plurality of test circuit modules 5c through 5e are collectively placed in a central portion of a semiconductor wafer W. Test wirings are provided so as to extend to respective chips CHs from the test circuit modules. Further, the test circuit modules 5c through 5e on the semiconductor wafer W, and the semiconductor chips CHs are respectively connected to one another by the aforementioned probing module or the like, whereby the chips may be tested.

While these test circuit modules 5c through 5e may have the same function, they may be caused to have dedicated functions respectively, e.g., they may be provided as test modules designed specifically for analog use, test modules designed specifically for digital use, etc. The provision of the plurality of test ICs 5c through 5e each having the dedicated test function over the wafer in this way allows a higher-precision test. Further, since they can capture a test function designed specifically for high-frequency use, etc., a test large in degree of freedom can be carried out.

Figure 15:
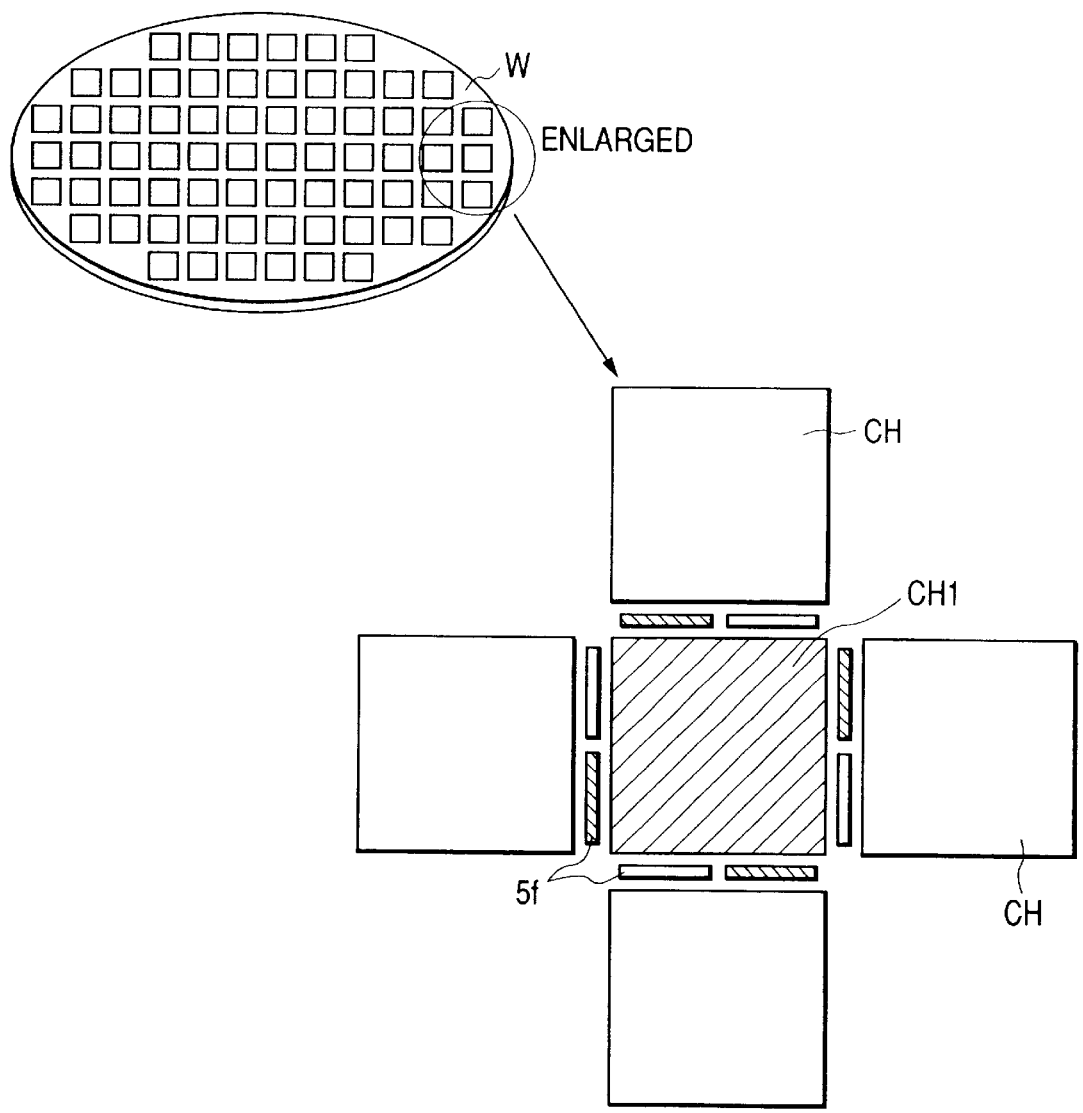
FIG. 15 is a diagram showing another example of the formation of test circuit modules on a semiconductor wafer to be tested, which is employed in a still further embodiment of the present invention.

Further, a test circuit module 5f is divided into four, which in turn may be placed at four peripheral portions of each semiconductor chip CH as shown in FIG. 15. For example, test circuit modules 5f (areas indicated by hatching) for testing a semiconductor chip CH1, and test circuit modules 5f (open areas) for testing other semiconductor chips CHs located in the neighborhood of the peripheral portion of the semiconductor chip CH1 are placed at the peripheral portion of the central semiconductor chip CH1 shown in FIG. 15. Since it is difficult to provide electrode pads in a scribe area relatively narrow in width in this case, they may be configured as follows: The electrode pads are formed in a space area of a peripheral portion of a semiconductor wafer W, and an insulative synthetic resin film such as PIQ (polyimide insulating film) or the like is formed on the surface of a final protective film located above wirings or each semiconductor chip formed in the scribe area as viewed from the electrode pads. Thereafter, the supply of power to each individual test circuit modules 5f through wirings formed on the insulative synthetic resin film may be carried out.

When such a configuration is taken, the test circuit modules 5f can evenly be laid out with respect to their corresponding semiconductor chips CHs. Further, a test functional portion for generating a test signal can be placed in the optimum position, i.e., at the side closest to each electrode pad to which the test signal is inputted, for each test function. Since the test circuit modules 5f are cut by dicing after the completion of testing, they do not any electrical influences on each semiconductor chip CH.

Further, as shown in FIG. 16, test circuit modules 5g are arranged at predetermined intervals on the side of a probe card 2b formed on a semiconductor wafer W1 different from a semiconductor wafer W to be tested, and a plurality of semiconductor chips CHs on the semiconductor wafer W, which correspond to one test circuit module 5g, may be tested by one test circuit module 5g. In the probe card 2b, ones marked with hatching indicate test circuit modules respectively, and ones other than those indicate areas in which bumps and wirings are formed. In FIG. 16, each circle mark indicates a range covered with one test circuit module 5g as an object to be tested.

FIG. 16 shows an example in which tests on nine semiconductor chips CHs corresponding to the sum of opposite chips and chips provided therearound are covered by one test circuit module 5g. In this case, needles 6b comprised of bumps B are provided on a semiconductor wafer W1 as shown in FIG. 17(b). Upon a wafer test, a main surface of the semiconductor wafer W1 used as a probe card 2b, on which each test circuit module 5g is formed, is superimposed on a main surface of a semiconductor wafer W, on which each semiconductor chip is formed, as shown in FIG. 17(a), whereby the needles 6b comprised of the bumps B are brought into contact with their corresponding electrode pads of the semiconductor chips CHs. It is thus possible to improve use durability. Incidentally, FIG. 17(b) is a partly enlarged view showing a portion indicated by symbol A in FIG. 17(a) in enlarged form.

FIG. 23 shows examples of mounting structures of semiconductor chips tested by the test circuit and cut out from a wafer. Of these, FIG. 23(a) shows a commonly-used one-chip one-package type structure, FIGS. 23(b) through (d) respectively show a structure in which a plurality of chips are encapsulated in one package, and FIGS. 23(e) and (f) respectively show a structure in which chips mounted on a substrate such as ceramic according to a face-down system are molded with a resin RS. In FIG. 23, CH indicates a semiconductor chip, PG indicates a package comprised of a resin or the like, BP indicates a bump provided on each electrode pad of the semiconductor chip CH, and LD indicates a lead terminal electrically connected to its corresponding electrode pad of the semiconductor chip CH with the bump BP interposed therebetween.

Figure 23A:
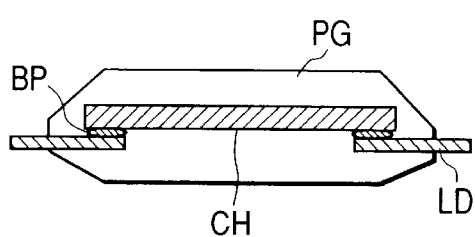
FIGS. 23(a), 23(b), 23(c), 23(d), 23(e) and 23(f) are respectively sectional explanatory diagrams illustrating example of mounting structures of semiconductor chips cut from a wafer.
Figure 23B:
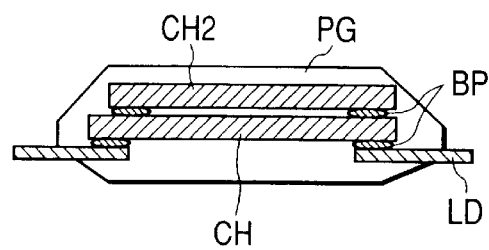
Figure 23C:
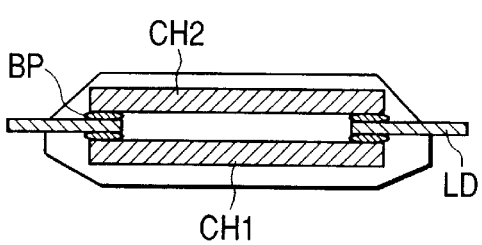
Figure 23D:
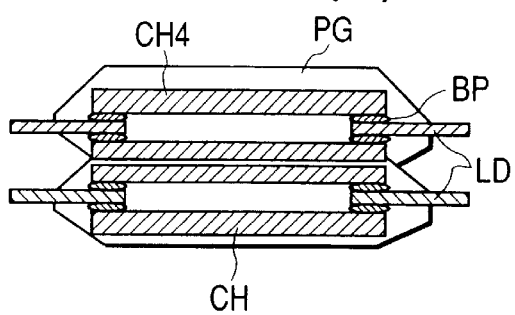
Figure 23E:
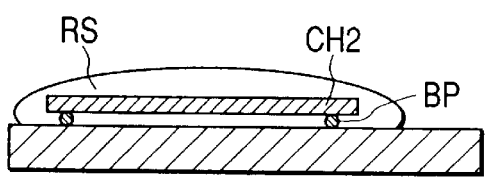
Figure 23F:
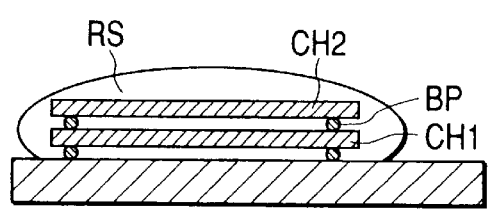

Of the above structures, one shown in FIG. 23 is capable of performing a chip test by the conventional tester, whereas ones shown in FIGS. 23(b) through (d) include two or more chips within the packages respectively. Therefore, if the respective chips do not exist as independent chips as viewed from the tester, i.e., if separately-testable configurations are not taken where the chips are tested by the tester, then a test pattern becomes so complex, and the development of a test program and a test execution time become so long. Since the upper chips CH2 must be tested through the lower chip CH1 in the structures shown in FIGS. 23(b) and (f) in particular, separate tests cannot be carried out. Even in the structure shown in FIG. 23(e), a post-mounting test is difficult because no electrode pads in each chip are exposed.

Thus, the test system described in the above embodiment, which is carried out in the wafer stage, may preferably be adopted for the semiconductor chips having the mounting structures shown in FIGS. 23(b) through (f). According to this, a test program is far simplified as compared with the test using the conventional tester, and a test execution time is shortened.

Next, a specific example of an ALPG used as a test circuit, which is constructed within an FPGA and generates each test pattern where each semiconductor chip to be tested is of a logic integrated circuit (logic IC), will be explained with reference to FIGS. 24 through 27. Of these, FIG. 24 shows a schematic configuration of the entire ALPG which generates test signals for a plurality of input terminals of each semiconductor chip in a shared resource system under the control of a common control circuit in accordance with a predetermined algorithm, and a specific example of a sequence control circuit or sequence controller.

Figure 24:
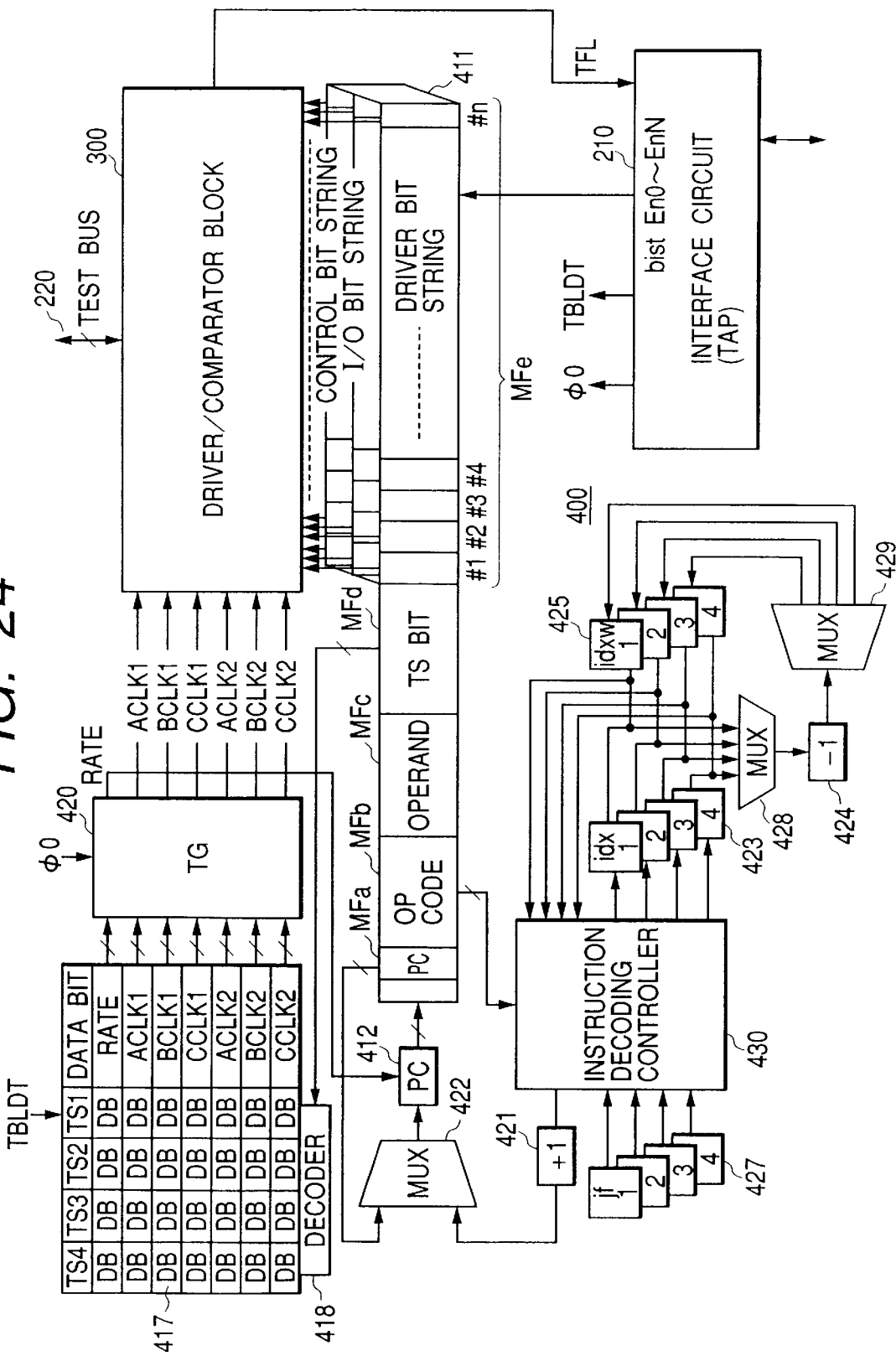
FIG. 24 is a block diagram showing an example of a configuration of an ALPG used as a test circuit employed in the present invention.
Figure 25:
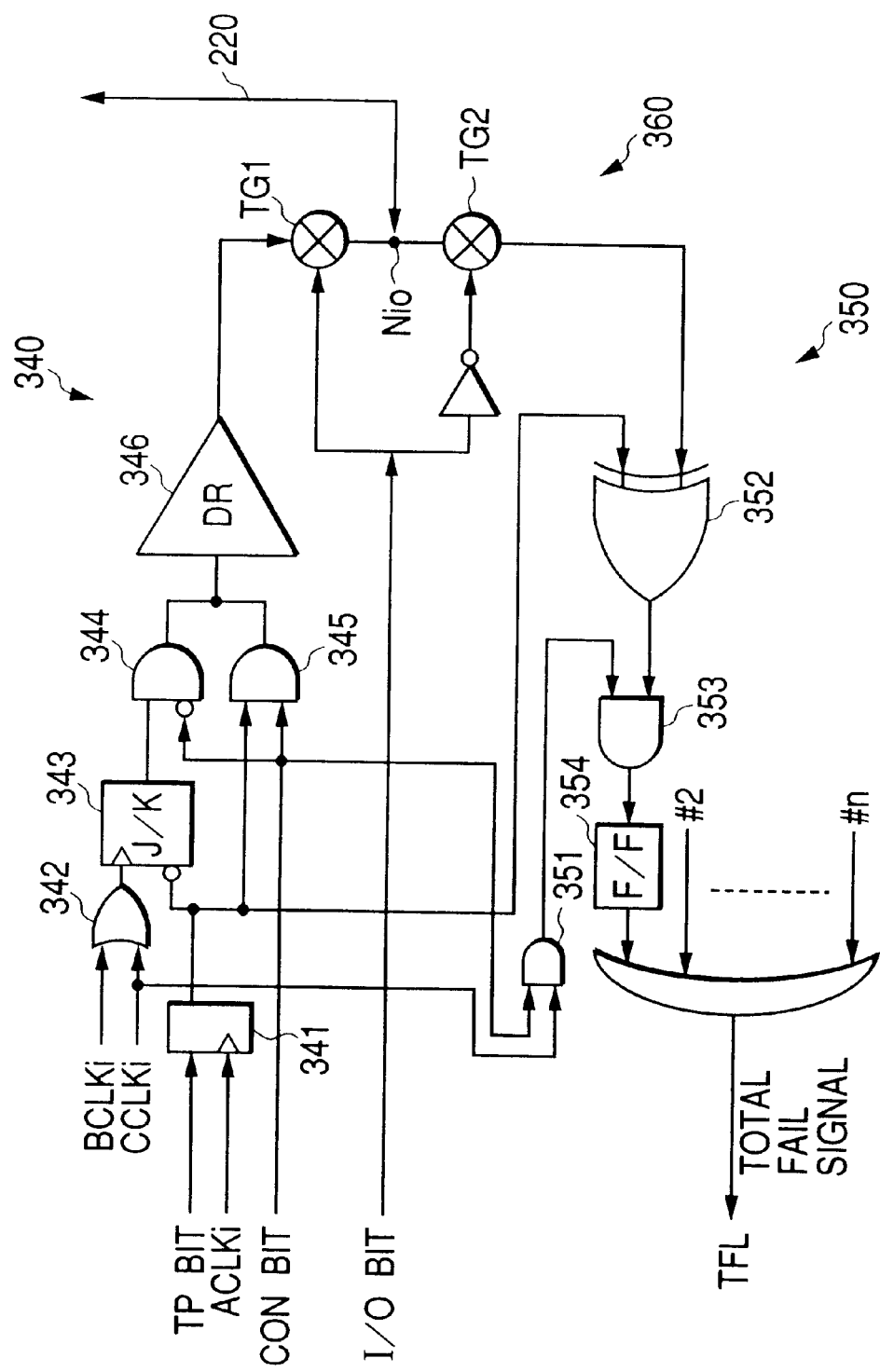
FIG. 25 is a logic configurational diagram illustrating a specific example of a driver/comparator circuit which constitutes the ALPG.
Figure 27:
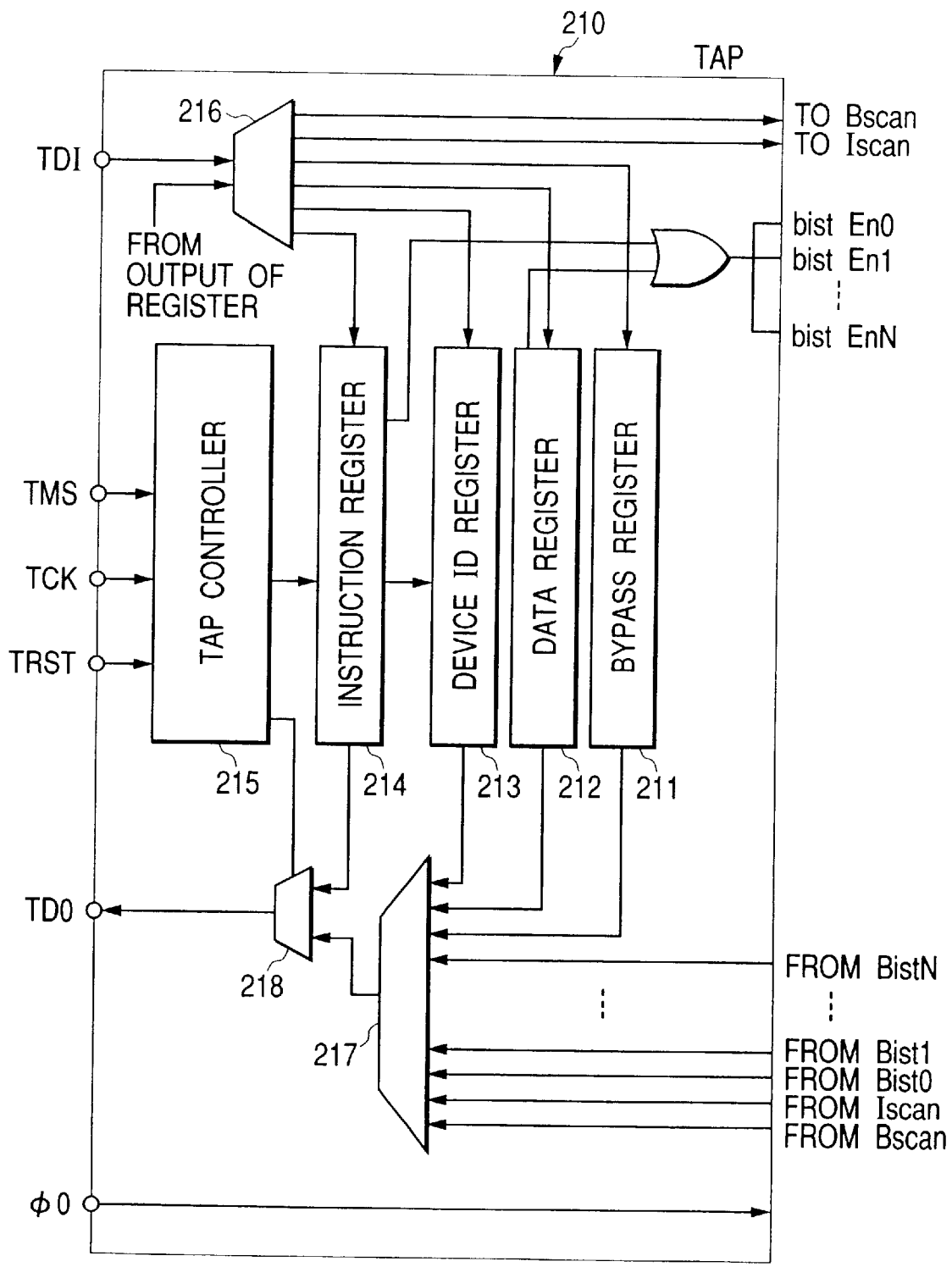
FIG. 27 is a block diagram showing an example of a configuration of an interface circuit which constitutes an ALPG.

The ALPG shown in FIG. 24 comprises a sequence control circuit 400 for sequentially controlling the entire ALPG, a driver/comparator block 300 for generating each of test signals in response to a control signal outputted from the sequence control circuit 400, receiving a signal outputted from a logic circuit (semiconductor chip) to be tested and comparing it with each expected value, thereby outputting a pass/fail decision signal, and an interface circuit 210 for interfacing between the ALPG and an external control device. A specific example of the driver/comparator block 300 is illustrated in FIG. 25, and a specific example of the interface circuit 210 is illustrated in FIG. 27.

As shown in FIG. 24, the sequence control circuit 400 of the respective circuits includes an instruction memory 411 in which a microprogram comprising a plurality of microinstruction groups described in accordance with a predetermined test pattern generating algorithm is stored, a program counter 412 for specifying a microinstruction to be read from the instruction memory 411, an instruction decoding controller 430 for decoding an instruction code lying in the microinstruction read from the instruction memory 411 and forming control signals for circuits lying within the sequence control circuit 400, such as the program counter 412, etc., a timing generator 420 for forming timing control signals, based on a reference clock φ0, a data register set 417 for outputting control data for the timing generator 420, based on a timing set bit MFd (TS bit) lying in the microinstruction, a decoder 418 for decoding the timing set bit MFd (TS bit) lying within the microinstruction to read control data from the data register set 417, etc. The instruction memory 411 and the data register set 417 respectively comprise a data rewritable RAM or an EEPROM or the like.

In the case of a circuit (e.g., ALU: Arithmetic Logic Unit) whose function is specified, of the logic circuits to be tested, a suitable test pattern forming system has already been established in most cases. Therefore, utilizing the property of the test pattern can generate a test pattern satisfactory in efficiency. As to a combination logic circuit, a failure pre-sumption method and a method of generating an efficient test pattern called "D algorithm" based on the idea of a single failure that one failure occurs in one circuit. The use of this method allows the shortening of the microprogram for the generation of the test pattern and makes it possible to control a increase in the capacity of the instruction memory 411 to an implementable extent.

In the ALPG employed in the present embodiment, although not restricted in particular, the timing set bit TS decoded by the decoder 418 comprises two bits, and seven control data are stored in the data register set 417. Of these control data, one corresponds to data "RATE" for defining a test cycle, and the remaining six control data respectively correspond to two types of control data "ACLK1", "ACLK2" each of which provides a output timing for a high level signal or a low level signal for each signal line used for a test bus, two types of control data "BCLK1", "BCLK2" each of which gives a timing provided to allow a pulse signal to rise, and two types of control data "CCLK1", "CCLK2" each of which provides an output timing for comparison between the rise timing of the pulse signal and each expected value.

When these respective control data are supplied to the timing generator 420, a signal RATE having timing predefined as to the control data RATE is supplied to the program counter 412 and a microinstruction code is captured from the instruction memory 411. When the "ACLK1" through "CCLK2" are supplied to the timing generator 420, clocks corresponding to control codes, of the timing clocks ACLK1 through CCLK2 are outputted to the driver/comparator circuit 300. Connections or selection for the use of the respective clocks are suitably carried out as needed.

Further, the sequence control circuit 400 of the ALPG is provided with a incrementer 421 for incrementing the value of the program counter 412 to "+1", a multiplexer 422 for selecting either the incrementer 421 or a jump address lying within an address field MFa and supplying it to the program counter 412, an index register 423 for holding a repetition number lying within an operand field MFc, a decrementer 424 for decrementing the value of the index register 423 by "−1", a working register 425 for holding the value decremented to "−1", a flag 427 for indicating the presence or absence of the transfer of an operand used according to a predetermined instruction to the program counter 412, a multiplexer 429 for selectively supplying the values of the registers 423 and 425 to the decrementer 424, a demultiplexer 429 for distributing the value of the decrementer 424 to any plane of the working register 425, etc.

Since the ALPG shown in FIG. 24 includes the operand field MFc for storing an instruction repetition number in the microinstruction code and the index register 423 for holding the repetition number, the required number of microinstructions can be reduced and the microprogram can be shortened when the same test signal is repeatedly generated. Further, since the index register 423, the working register 425 and the flag 427 are respectively provided in the ALPG employed in the present embodiment in the form of a plurality of planes (four in the drawing), a sub-loop process lying within a given loop process, and a sub-loop process lying within the sub-loop process can easily be executed, and hence the microprogram can be shortened.

FIG. 25 shows a specific example of the driver/comparator circuit 300. Incidentally, only a driver/comparator circuit corresponding to one of signal lines constituting a test bus 220 is typically illustrated as the circuit shown in FIG. 25. However, the circuit shown in FIG.

25 is actually provided by the number of the signal lines constituting the test bus 220. Further, the test bus is formed in a scribe area on a wafer, and the ALPG and a semiconductor chip used as each logic circuit to be tested are connected to each other.

As shown in FIG. 25, the driver/comparator circuit employed in the present embodiment comprises a driver circuit (signal forming circuit) 340 for forming a signal outputted to the test bus, a comparator circuit (comparison circuit) 350 for comparing each signal on the test bus and each expected value signal to perform a coincidence/non-coincidence comparison, and a switching circuit 360 for performing switching between the driver circuit 340 and the comparator circuit 350. The switching circuit 360 comprises a transmission gate TG1 provided between the driver circuit 340 and an input/output node Nio, and a transmission gate TG2 provided between the input/output node Nio and the comparator circuit 350. Either one of the transmission gates is made open in response to an input/output control bit I/O supplied from the sequence control circuit 400, whereas the other thereof is brought to a cut-off state.

The driver circuit 340 comprises an edge trigger type flip-flop 341 for capturing or taking in an input/output control bit TP according to a timing clock ACLKi supplied from the timing generator 420 and holding it therein, an OR gate 342 for ORing timing clocks BCLKi and CCLKi supplied from the timing generator 420, a J/K flip-flop 343 for receiving the output of the OR gate 342 and the output of the edge trigger type flip-flop 341 as input signals, an AND gate 344 for receiving the output of the J/K flip-flop 343 and an input/output control bit CONT supplied from the sequence control circuit 400, an AND gate 345 for receiving the output of the edge trigger type flip-flop 341 and the input/output control bit CONT supplied from the sequence control circuit 400, and a driver 346 for driving the test bus according to the outputs of these AND gates 344 and 345.

On the other hand, the comparator circuit 350 comprises an AND gate 351 for receiving the timing clock CCLKi supplied from the timing generator 420 and the input/output control bit CONT supplied from the sequence control circuit 400 as input signals, an exclusive OR gate 352 for receiving the output (expected value) of the D type flip-flop 341 and a signal on the test bus, which is supplied through the transmission gate TG2, as input signals, an AND gate 353 for receiving the outputs of the exclusive OR gate 352 and the AND gate 351 as input signals, and a flip-flop 354 for latching the output of the AND gate 353. A signal obtained by ORing the outputs of all the comparator circuits 350 is outputted as a total fail signal TFL. The input/output control bits I/O, TP and CONT respectively correspond to the above control signals.

As shown in FIG. 24, the microinstruction employed in the ALPG of the present embodiment comprises an address field MFa in which an PC address indicative of a jump address for an instruction, which is used in a jump instruction, is stored, an op code field MFb in which a sequence control code is stored, an operand field MFc in which an instruction repetition number and the like are stored, a timing set field MFd in which a timing set bit TS for reading a control signal for the timing generator 420 from the data register set 14 is stored, and an input/output control field MFe in which input/output control bits for the driver/comparator circuit 300 are stored.

The timing set bit TS stored in the timing set field MFd comprises two bits in the present embodiment as described above. However, three or more bits may be provided.

Further, the input/output control bits stored in the input/output control field MFe are provided with only n sets with three bits of a driver bit TP, an I/O bit and a control bit CONT as one set in association with n signal lines of the test bus 220. Of these bits, the I/O bit is a control bit for specifying either the input or the output. When the I/O bit is "1", the transmission gate TG1 is opened and the transmission gate TG2 is cut off to thereby output a signal outputted from the driver to its corresponding signal line of the test bus 220. When the I/O bit is "0", the transmission gate TG1 is cut off and the transmission gate TG2 is opened to thereby input a signal on the corresponding signal line of the test bus 220 to the gate 352 for comparison. The driver bit TP and the control bit CONT specify either a high output or a low output, the output of either a positive pulse or a negative pulse, and an input invalid state or an output high impedance state according to a combination thereof.

Table 1 shows the relationship between the input/output control bits TP, I/O and CONT and the test signals (test patterns) outputted from the driver/comparator circuit 300.

[Table 1]

| Output Test Signal | TP | I/O | CONT | Remarks |
| --- | --- | --- | --- | --- |
| 1 | 1 | 1 | 1 | Hi drive |
| 0 | 0 | 1 | 1 | Low drive |
| P | 1 | 1 | 0 | Positive Pulse |
| N | 0 | 1 | 0 | Negative Pulse |
| H | 1 | 0 | 1 | Hi expectation |
| L | 0 | 0 | 1 | Low expectation |
| X | 1 | 0 | 0 | don't care |
| Z | 0 | 0 | 0 | Reserved (Hi-Z) |

As shown in Table 1, the driver circuit 340 is controlled so as to output a signal having a high level when the input/output control bits TP, I/O and CONT are given as "111". Further, when they are given as "011", the driver circuit 340 is controlled so as to output a signal having a low level. When they are given as "110", the driver circuit 340 is controlled so as to output a positive pulse signal, and when they are given as "010", the driver circuit 340 is controlled so as to output a negative pulse signal. On the other hand, when the input/output control bits TP, I/O and CONT are given as "101", the comparator circuit 350 expects an input signal having a high level. When they are given as "001", the comparator circuit 350 expects an input signal having a low level. Further, when they are given as "100", the comparator circuit 350 is controlled so as to invalidate an input signal.

Incidentally, the driver/comparator circuit 300 employed in the present embodiment is configured so that the state that the control bits TP, I/O and CONT are brought to "000", does not have any means. However, when the control bits TP, I/O and CONT are given as "000", for example, the transmission gate TG1 is closed and the transmission gate TG2 is made open. Further, the exclusive OR gate 352 is set as a Schmit circuit operated with two levels lying between the high and low levels. In this condition, the driver/comparator circuit 300 may be configured so as to be able to compare a state (high impedance state) in which the potential of the input/output node Nio connected to the test bus 220 exists between the two levels.

Figure 26:
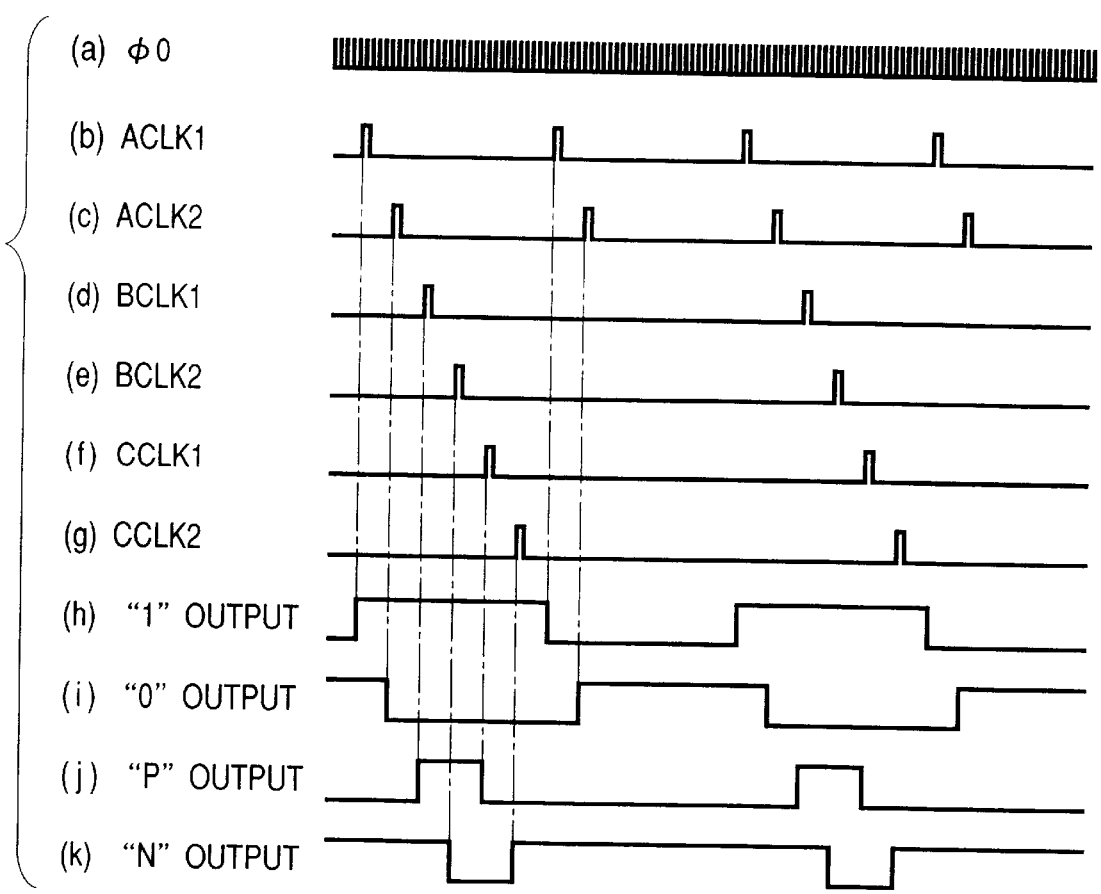
FIGS. 26(a), 26(b), 26(c), 26(d), 26(e), 26(f), 26(g), 26(h), 26(i), 26(j) and 26(k) are respectively waveform charts showing one examples of test signal waveforms formed by the ALPG shown in FIG. 24.

FIG. 26 shows one examples of the timing clocks ACLK1 through CCLK2 supplied from the timing generator 420 and the signals outputted onto the test bus 220 from the driver/comparator circuit 300, which are employed in the aforementioned embodiment. In FIG. 26, FIG. 26(a) shows a reference clock φ0 supplied from the outside, FIGS. 26(b)

through (g) indicate the waveforms of the timing clocks ACLK1 through CCLK2, and FIG. 26(h) shows the waveform of an output signal at a terminal at which "1" is specified as the output test signal in Table 1 and ACLK1 is selected as a clock. Further, FIG. 26(i) shows the waveform of an output signal at a terminal at which "0" is specified as the output test signal in Table 1 and ACLK2 is selected as a clock. FIG. 26(j) shows the waveform of an output signal at a terminal at which "P" is specified as the output test signal in Table 1 and BCLK1 and CCLK1 are selected as clocks. Furthermore, FIG. 26(k) shows the waveform of an output signal at a terminal at which "N" is specified as the output test signal in Table 1 and BCLK2 and CCLK2 are selected as clocks.

As is understood from FIG. 26, such a high level signal as shown in FIG. 26(h) is outputted according to the clock ACLK1 from the terminal at which the input/output control bits TP, I/O and CONT are set to "111" and the clock ACLK1 is specified. Such a low level signal as shown in FIG. 26(i) is outputted according to the clock ACLK2 from the terminal at which the input/output control bits TP, I/O and CONT are set to "011" and the clock ACLK2 is specified. Such a positive pulse as shown in FIG. 26(j) whose edges are defined as BCLK1 and CCLK1, is outputted according to data set based on the clock ACLK1 from the terminal at which the input/output control bits TP, I/O and CONT are set to "110" and the clocks ACLK1, BCLK1 and CCLK1 are specified. Further, such a negative pulse as shown in FIG. 26(k) whose edges are defined as BCLK2 and CCLK2, is outputted according to data set based on the clock ACLK2 from the terminal at which the input/output control bits TP, I/O and CONT are set to "010" and the clocks ACLK2, BCLK2 and CCLK2 are specified.

Although not shown in the drawing, each expected value is rendered high in level at the terminal at which the input/output control bits TP, I/O and CONT are set to "101" and the clock CCLK1 is specified, and is compared with the clock CCLK1 shown in FIG. 26(f), which is used as a strobe signal. At the terminal at which the input/output control bits TP, I/O and CONT are set to "001" and the clock CCLK2 is specified, each expected value is rendered low in level and compared with the clock CCLK2 shown in FIG. 26(g), which is used as a strobe signal. Incidentally, the selection of each clock is not limited to the above and can be set as an arbitrary combination.

The ALPG having the above configuration rewrites the program stored in the instruction memory 411 and the control data stored in the data register set 417 to thereby make it possible to arbitrarily change each generated test pattern and timing provided to output it. Therefore, even when semiconductor chips to be tested are different from each other, the ALPG having the same architecture can be formed on the same wafer for testing. If objects to be tested belong to the same category as in the case of a logic IC and a memory even when the ALPG having the same architecture cannot be used, then the ALPG for testing the same would be similar in architecture. Therefore, designing the optimum ALPG every semiconductor chips does not place a significant burden on a designer so much.

On the other hand, it is necessary that when data is rewritten with the ALPG as a programmable device as described above, it can be connected to an external device. Therefore, the ALPG employed in the embodiment shown in FIG. 24 is provided with the interface circuit 210. FIG. 27 shows a specific example of the interface circuit 210. When the test circuit is formed on the same wafer as each semiconductor chip to be tested, it is not desirable that the number of electrode pads for connecting to the external device increases for the purpose of rewriting data in the test circuit. In the ALPG employed in the present embodiment to avoid this, the TAP (Test Access Port) 210 defined by the IEEE1149.1 Standards is used as an interface circuit to the external device. Since the TAP is used as the interface, the number of the electrode pads for connecting to the external device for the purpose of rewriting the data may be several.

The TAP serves as an interface and a control circuit for a scan test and a BIST circuit defined by the IEEE1149.1 Standards and comprises a bypass register 211 used when test data from an input port is shifted to an output port, a data register 212 used when a specific signal is transferred to its corresponding circuit, a device ID register 213 for setting a manufacturing identification number inherent in each chip, an instruction register 214 used to control the selection of the data register and an internal test method, a controller 215 for controlling the entire TAP circuit, etc.

The data register 212 is an optional register. Four essential instructions and three optional instructions are prepared as instructions set to the instruction register 214. A test mode select signal TMS for specifying or designating a test mode, a test clock TCK and a reset signal TRST are inputted to the controller 215 from three dedicated external terminals. Based on these signals, the controller 215 forms control signals with respect to the registers 211 through 214 and selector circuits 216 through 218.

Further, the TAP is provided with an input terminal for test data TDI, and an output terminal for test result data TDO. The input test data TDI is supplied to the respective registers 211 through 214 or internal scan paths Iscan and Bscan through the selector circuit 216. Further, the contents of the registers 211 through 214 and scan out data from internal circuits are outputted to the outside of the chip through the selector circuits 217 and 218. Furthermore, the TAP is configured so as to form a signal for the internal BIST circuit in accordance with the contents of the data register 212 and the instruction register 214 and supply it therefrom and so as to be capable of outputting a signal indicative of a test result outputted from the BIST circuit to the outside of each chip through the selector circuits 217 and 218.

In the test system of the present invention, the test circuit (ALPG) formed on the wafer with the tested logic circuits (semiconductor chips) formed thereon is regarded as the BIST circuit. Further, the signal input/output function for the BIST circuit having the TAP is used to input the set data for the data register set 417 of the ALPG and the microprogram stored in the instruction memory 411 and output the result of test by the ALPG. The clock φ0 for the timing generator 420 of the ALPG is also supplied through the TAP 210. While the clock φ0 for the timing generator 420 is regarded as a clock different from the clock TCK of the TAP 210 in FIG. 27, the TCK may be supplied to the timing generator 420 in placed of the clock φ0.

In FIG. 27, "Iscan" means a test path for diagnosing each internal logic circuit by using a shift register in which flip-flops constituting the internal logic circuit are coupled in chain form, as a scan path for test data. Further, "Bscan" means a test path for conducting diagnosis (boundary scan test) on the state of connection to another semiconductor integrated circuit by using a shift register in which flip-flops provided within a signal input/output unit are coupled in chain form, as a scan path. A function for performing these scan tests and a function for performing the boundary scan test, both included in the TAP will be omitted because they are not used in the test system according to the present embodiment.

The invention made by the present inventors has been described above specifically by the embodiments of the invention. However, the present invention is not limited to the embodiments. It is needless to say that various changes can be made thereto within the scope not departing from the substance thereof. For example, the embodiment shown in FIGS. 9 and 10 has described that the test circuit is placed on the wafer on which each semiconductor chip to be tested is formed, and the ALPG shown in FIG. 24 is used as the test circuit. However, an FPGA is formed on the wafer on which each semiconductor chip to be tested is formed, in place of the direct formation of the ALPG shown in FIG. 24 on the wafer, and such an ALPG as shown in FIG. 24 is constructed within the FPGA, whereby each semiconductor chip may be tested.

In the embodiment shown in FIG. 24 as well, the TAP is used for interfacing to the external device when the test circuit is placed on the wafer with each semiconductor chip to be tested formed thereon. However, even when the test circuit is configured in the aforementioned probe card or the probing module, the TAP may be used as the interface thereto.

Advantageous effects obtained by a typical one of the inventions disclosed in the present application will be described in brief as follows:

Namely, according to the present invention, each developed semiconductor chip can be tested without having to use an expensive tester, whereby the total cost necessary for testing can greatly be reduced. According to the present invention as well, a test in a wafer stage can be carried out. Further, the execution of the wafer test within an aging device allows the simplification or omission of a test subsequent to packaging and permits a great reduction in test time, thus making it possible to improve manufacturing efficiency. The time required between the commencement of design of a semiconductor integrated circuit and its completion can be shortened.

What is claimed is:

1. A test system which performs electrical tests on semiconductor chips formed on a semiconductor wafer, comprising:
    a probe card which is provided with conductive needles in alignment with the placement of electrode pads in the semiconductor chips and connected to a plurality of test circuits, each of said test circuits being placed on said probe card, and arranged to provide test input signals to said semiconductor chips and receive output signals from said semiconductor chips to generate a test result based on a program; and
    a control device which writes said program in said test circuit and stores therein said test result outputted from said test circuit.

2. The test system according to claim 1, wherein said test circuit includes an FPGA or a microcomputer device.

3. A test system according to claim 1, wherein the test circuits are test chips mounted on the probe card.

4. A test system according to claim 1, wherein the probe card comprises a frame and a semiconductor substrate in which the plurality of test circuits are formed.

5. A test system according to claim 4, wherein the conductive needles are formed on a surface of the semiconductor substrate.

6. A test system which conducts electrical tests on semiconductor chips formed on a semiconductor wafer, comprising:
    a test circuit, which provides test input signals to said semiconductor chips and receives output signals from said semiconductor chips to generate a test result, formed on said semiconductor wafer,
    a probing module having test wirings formed therein, which connect the semiconductor chips and said test circuit; and
    a power supply device which supplies power to said each semiconductor chip and said test circuit through said probing module.

7. The test system according to claim 6, wherein said test circuit includes an FPGA or a microcomputer device.

8. The test system according to claim 7, wherein said test circuit conducts tests on a plurality of semiconductor chips formed on a semiconductor wafer.

9. A test system according to claim 6, wherein the test circuit is surrounded by a plurality of said semiconductor chips to be tested.

10. A test system which performs electrical tests on semiconductor chips formed on a semiconductor wafer, comprising:
    a test circuit which provides test input signals to said semiconductor chips and receives output signals from said semiconductor chips to generate a test a result, wherein said test circuit is formed in a scribe area or a chip area in the semiconductor wafer; and
    test wirings which are formed in the scribe area or a test wiring layer in the semiconductor wafer and connect said test circuit to the semiconductor chips.

11. The test system according to claim 10, wherein said test circuit includes an FPGA or a microcomputer device.

12. The test system according to claim 11, wherein said test circuit conducts tests on a plurality of semiconductor chips formed on a semiconductor wafer.

* * * * *